US008791382B2

(12) United States Patent
Whitt, III et al.

(10) Patent No.: US 8,791,382 B2
(45) Date of Patent: Jul. 29, 2014

(54) INPUT DEVICE SECURING TECHNIQUES

(75) Inventors: David Otto Whitt, III, Sammamish, WA (US); Timothy C. Shaw, Sammamish, WA (US); Rob Huala, Bellevue, WA (US); David C. Vandervoort, Seattle, WA (US); Matthew David Mickelson, Seattle, WA (US); Christopher Harry Stoumbos, Sammamish, WA (US); Joel Lawrence Pelley, Bellevue, WA (US); Todd David Pleake, Sammamish, WA (US); Hua Wang, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 13/471,139

(22) Filed: May 14, 2012

(65) Prior Publication Data
US 2013/0228439 A1    Sep. 5, 2013

Related U.S. Application Data

(60) Provisional application No. 61/606,321, filed on Mar. 2, 2012, provisional application No. 61/606,301, filed on Mar. 2, 2012, provisional application No. 61/606,313, filed on Mar. 2, 2012, provisional application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.
*H01H 1/12* (2006.01)
*H01H 13/702* (2006.01)

(52) U.S. Cl.
CPC .................... *H01H 13/702* (2013.01)
USPC ........................................... 200/512

(58) Field of Classification Search
CPC .. H01H 13/702; H01H 13/703; H01H 13/704
USPC .................................... 200/515, 512
See application file for complete search history.

(56) References Cited

U.S. PATENT DOCUMENTS 578,325 A       3/1897  Fleming
4,046,975 A *   9/1977  Seeger, Jr. .................. 200/515

(Continued)

FOREIGN PATENT DOCUMENTS

CN      103455149       12/2013
EP      1223722         7/2002

(Continued)

OTHER PUBLICATIONS

"Accessing Device Sensors", retrieved from <https://developer.palm.com/content/api/dev-guide/pdk/accessing-device-sensors.html> on May 25, 2012, 4 pages.

(Continued)

*Primary Examiner* — Felix O Figueroa
(74) *Attorney, Agent, or Firm* — Jeremy Snodgrass; Glen Johnson; Micky Minhas

(57) ABSTRACT

Input device adhesive techniques are described. A pressure sensitive key includes a sensor substrate having one or more conductors, a spacer layer, and a flexible contact layer. The spacer layer is disposed proximal to the sensor substrate and has at least one opening. The flexible contact layer is spaced apart from the sensor substrate by the spacer layer and configured to flex through the opening in response to an applied pressure to initiate an input. The flexible contact layer is secured to the spacer layer such that at first edge, the flexible contact layer is secured to the spacer layer at an approximate midpoint of the first edge and is not secured to the spacer along another portion of the first edge and at a second edge, the flexible contact layer is not secured to the spacer layer along an approximate midpoint of the second edge.

18 Claims, 7 Drawing Sheets

(56) References Cited

U.S. PATENT DOCUMENTS

| | | | |
|---|---|---|---|
| 4,065,649 A | 12/1977 | Carter et al. | |
| 4,243,861 A | 1/1981 | Strandwitz | |
| 4,302,648 A | 11/1981 | Sado et al. | |
| 4,317,013 A | 2/1982 | Larson | |
| 4,365,130 A * | 12/1982 | Christensen | 200/515 |
| 4,492,829 A | 1/1985 | Rodrique | |
| 4,527,021 A | 7/1985 | Morikawa et al. | |
| 4,559,426 A | 12/1985 | Van Zeeland et al. | |
| 4,576,436 A | 3/1986 | Daniel | |
| 4,577,822 A | 3/1986 | Wilkerson | |
| 4,588,187 A | 5/1986 | Dell | |
| 4,607,147 A | 8/1986 | Ono et al. | |
| 4,615,579 A | 10/1986 | Whitehead | |
| 4,651,133 A | 3/1987 | Ganesan et al. | |
| 4,735,394 A | 4/1988 | Facco | |
| 5,008,497 A | 4/1991 | Asher | |
| 5,128,829 A | 7/1992 | Loew | |
| 5,220,521 A | 6/1993 | Kikinis | |
| 5,249,978 A | 10/1993 | Gazda et al. | |
| 5,283,559 A | 2/1994 | Kalenda et al. | |
| 5,331,443 A | 7/1994 | Stanisci | |
| 5,339,382 A | 8/1994 | Whitehead | |
| 5,375,076 A | 12/1994 | Goodrich et al. | |
| 5,406,415 A | 4/1995 | Kelly | |
| 5,480,118 A | 1/1996 | Cross | |
| 5,546,271 A | 8/1996 | Gut et al. | |
| 5,548,477 A | 8/1996 | Kumar et al. | |
| 5,558,577 A | 9/1996 | Kato | |
| 5,618,232 A | 4/1997 | Martin | |
| 5,621,494 A | 4/1997 | Kazumi et al. | |
| 5,681,220 A | 10/1997 | Bertram et al. | |
| 5,737,183 A | 4/1998 | Kobayashi et al. | |
| 5,745,376 A | 4/1998 | Barker et al. | |
| 5,748,114 A | 5/1998 | Koehn | |
| 5,781,406 A | 7/1998 | Hunte | |
| 5,807,175 A * | 9/1998 | Davis et al. | |
| 5,818,361 A | 10/1998 | Acevedo | |
| 5,828,770 A | 10/1998 | Leis et al. | |
| 5,842,027 A | 11/1998 | Oprescu et al. | |
| 5,861,990 A | 1/1999 | Tedesco | |
| 5,874,697 A | 2/1999 | Selker et al. | |
| 5,905,485 A | 5/1999 | Podoloff | |
| 5,926,170 A | 7/1999 | Oba | |
| 5,929,946 A | 7/1999 | Sharp et al. | |
| 5,971,635 A | 10/1999 | Wise | |
| 5,999,147 A | 12/1999 | Teitel | |
| 6,002,389 A | 12/1999 | Kasser | |
| 6,005,209 A | 12/1999 | Burleson et al. | |
| 6,012,714 A | 1/2000 | Worley et al. | |
| 6,040,823 A | 3/2000 | Seffernick et al. | |
| 6,044,717 A | 4/2000 | Biegelsen et al. | |
| 6,046,857 A | 4/2000 | Morishima et al. | |
| 6,061,644 A | 5/2000 | Leis | |
| 6,108,200 A | 8/2000 | Fullerton | |
| 6,112,797 A | 9/2000 | Colson et al. | |
| 6,128,007 A | 10/2000 | Seybold | |
| 6,178,443 B1 | 1/2001 | Lin | |
| 6,232,934 B1 | 5/2001 | Heacock et al. | |
| 6,234,820 B1 | 5/2001 | Perino et al. | |
| 6,254,105 B1 | 7/2001 | Rinde et al. | |
| 6,279,060 B1 | 8/2001 | Luke et al. | |
| 6,300,986 B1 | 10/2001 | Travis | |
| 6,329,617 B1 | 12/2001 | Burgess | |
| 6,344,791 B1 | 2/2002 | Armstrong | |
| 6,353,503 B1 | 3/2002 | Spitzer et al. | |
| 6,366,440 B1 | 4/2002 | Kung | |
| 6,380,497 B1 | 4/2002 | Hashimoto et al. | |
| 6,437,682 B1 * | 8/2002 | Vance | 200/512 |
| 6,506,983 B1 | 1/2003 | Babb et al. | |
| 6,511,378 B1 | 1/2003 | Bhatt et al. | |
| 6,532,147 B1 | 3/2003 | Christ, Jr. | |
| 6,543,949 B1 | 4/2003 | Ritchey et al. | |
| 6,565,439 B2 | 5/2003 | Shinohara et al. | |
| 6,597,347 B1 | 7/2003 | Yasutake | |
| 6,600,121 B1 | 7/2003 | Olodort et al. | |
| 6,603,408 B1 | 8/2003 | Gaba | |
| 6,608,664 B1 | 8/2003 | Hasegawa | |
| 6,617,536 B2 * | 9/2003 | Kawaguchi | 200/512 |
| 6,651,943 B2 | 11/2003 | Cho et al. | |
| 6,685,369 B2 | 2/2004 | Lien | |
| 6,695,273 B2 | 2/2004 | Iguchi | |
| 6,704,864 B1 | 3/2004 | Philyaw | |
| 6,721,019 B2 | 4/2004 | Kono et al. | |
| 6,725,318 B1 | 4/2004 | Sherman et al. | |
| 6,774,888 B1 | 8/2004 | Genduso | |
| 6,776,546 B2 | 8/2004 | Kraus et al. | |
| 6,781,819 B2 | 8/2004 | Yang et al. | |
| 6,784,869 B1 | 8/2004 | Clark et al. | |
| 6,790,054 B1 | 9/2004 | Boonsue | |
| 6,795,146 B2 | 9/2004 | Dozov et al. | |
| 6,813,143 B2 | 11/2004 | Makela | |
| 6,819,316 B2 | 11/2004 | Schulz et al. | |
| 6,847,488 B2 | 1/2005 | Travis | |
| 6,856,506 B2 | 2/2005 | Doherty et al. | |
| 6,861,961 B2 | 3/2005 | Sandbach et al. | |
| 6,898,315 B2 | 5/2005 | Guha | |
| 6,914,197 B2 | 7/2005 | Doherty et al. | |
| 6,950,950 B2 | 9/2005 | Sawyers et al. | |
| 6,970,957 B1 | 11/2005 | Oshins et al. | |
| 6,976,799 B2 | 12/2005 | Kim et al. | |
| 7,007,238 B2 | 2/2006 | Glaser | |
| 7,025,908 B1 | 4/2006 | Hayashi et al. | |
| 7,051,149 B2 | 5/2006 | Wang et al. | |
| 7,068,496 B2 | 6/2006 | Wong et al. | |
| 7,083,295 B1 | 8/2006 | Hanna | |
| 7,091,436 B2 | 8/2006 | Serban | |
| 7,099,149 B2 | 8/2006 | Krieger et al. | |
| 7,101,048 B2 | 9/2006 | Travis | |
| 7,106,222 B2 | 9/2006 | Ward et al. | |
| 7,123,292 B1 | 10/2006 | Seeger et al. | |
| 7,129,979 B1 | 10/2006 | Lee | |
| 7,136,282 B1 | 11/2006 | Rebeske | |
| 7,152,985 B2 | 12/2006 | Benitez et al. | |
| D535,292 S | 1/2007 | Shi et al. | |
| 7,194,662 B2 | 3/2007 | Do et al. | |
| 7,199,931 B2 | 4/2007 | Boettiger et al. | |
| 7,213,991 B2 | 5/2007 | Chapman et al. | |
| 7,224,830 B2 | 5/2007 | Nefian et al. | |
| 7,260,221 B1 | 8/2007 | Atsmon | |
| 7,277,087 B2 | 10/2007 | Hill et al. | |
| 7,301,759 B2 | 11/2007 | Hsiung | |
| 7,311,526 B2 | 12/2007 | Rohrbach et al. | |
| 7,331,793 B2 | 2/2008 | Hernandez et al. | |
| 7,374,312 B2 | 5/2008 | Feng et al. | |
| 7,447,934 B2 | 11/2008 | Dasari et al. | |
| 7,467,948 B2 | 12/2008 | Lindberg et al. | |
| 7,469,386 B2 | 12/2008 | Bear et al. | |
| 7,486,165 B2 | 2/2009 | Ligtenberg et al. | |
| 7,499,037 B2 | 3/2009 | Lube | |
| 7,499,216 B2 | 3/2009 | Niv et al. | |
| 7,502,803 B2 | 3/2009 | Culter et al. | |
| 7,515,143 B2 | 4/2009 | Keam et al. | |
| 7,542,052 B2 | 6/2009 | Solomon et al. | |
| 7,558,594 B2 | 7/2009 | Wilson | |
| 7,559,834 B1 | 7/2009 | York | |
| 7,561,131 B2 | 7/2009 | Ijzerman et al. | |
| RE40,891 E | 9/2009 | Yasutake | |
| 7,620,244 B1 | 11/2009 | Collier | |
| 7,636,921 B2 | 12/2009 | Louie | |
| 7,639,876 B2 | 12/2009 | Clary et al. | |
| 7,643,213 B2 | 1/2010 | Boettiger et al. | |
| 7,656,392 B2 | 2/2010 | Bolender | |
| 7,686,694 B2 | 3/2010 | Cole | |
| 7,728,923 B2 | 6/2010 | Kim et al. | |
| 7,729,493 B2 | 6/2010 | Krieger et al. | |
| 7,731,147 B2 | 6/2010 | Rha | |
| 7,733,326 B1 | 6/2010 | Adiseshan | |
| 7,773,076 B2 | 8/2010 | Pittel et al. | |
| 7,773,121 B1 | 8/2010 | Huntsberger et al. | |
| 7,774,155 B2 | 8/2010 | Sato et al. | |
| 7,777,972 B1 | 8/2010 | Chen et al. | |
| 7,782,342 B2 | 8/2010 | Koh | |
| 7,813,715 B2 | 10/2010 | McKillop et al. | |
| 7,815,358 B2 | 10/2010 | Inditsky | |

(56) References Cited

U.S. PATENT DOCUMENTS

| | | |
|---|---|---|
| 7,822,338 B2 | 10/2010 | Wernersson |
| 7,855,716 B2 | 12/2010 | McCreary et al. |
| 7,865,639 B2 | 1/2011 | McCoy et al. |
| 7,884,807 B2 | 2/2011 | Hovden et al. |
| 7,898,797 B2 | 3/2011 | Fan et al. |
| D636,397 S | 4/2011 | Green |
| 7,918,559 B2 | 4/2011 | Tesar |
| 7,927,654 B2 | 4/2011 | Hagood et al. |
| 7,928,964 B2 | 4/2011 | Kolmykov-Zotov et al. |
| 7,936,501 B2 | 5/2011 | Smith et al. |
| 7,944,520 B2 | 5/2011 | Ichioka et al. |
| 7,945,717 B2 | 5/2011 | Rivalsi |
| 7,967,462 B2 | 6/2011 | Ogiro et al. |
| 7,970,246 B2 | 6/2011 | Travis et al. |
| 7,973,771 B2 | 7/2011 | Geaghan |
| 7,976,393 B2 | 7/2011 | Haga et al. |
| 7,978,281 B2 | 7/2011 | Vergith et al. |
| 8,016,255 B2 | 9/2011 | Lin |
| 8,018,386 B2 | 9/2011 | Qi et al. |
| 8,018,579 B1 | 9/2011 | Krah |
| 8,026,904 B2 | 9/2011 | Westerman |
| 8,053,688 B2 | 11/2011 | Conzola et al. |
| 8,065,624 B2 | 11/2011 | Morin et al. |
| 8,069,356 B2 | 11/2011 | Rathi et al. |
| RE42,992 E | 12/2011 | David |
| 8,077,160 B2 | 12/2011 | Land et al. |
| 8,090,885 B2 | 1/2012 | Callaghan et al. |
| 8,098,233 B2 | 1/2012 | Hotelling et al. |
| 8,102,362 B2 | 1/2012 | Ricks et al. |
| 8,115,499 B2 | 2/2012 | Osoinach et al. |
| 8,115,718 B2 | 2/2012 | Chen et al. |
| 8,117,362 B2 | 2/2012 | Rodriguez et al. |
| 8,118,274 B2 | 2/2012 | McClure et al. |
| 8,118,681 B2 | 2/2012 | Mattice et al. |
| 8,130,203 B2 | 3/2012 | Westerman |
| 8,154,524 B2 | 4/2012 | Wilson et al. |
| 8,162,282 B2 | 4/2012 | Hu et al. |
| D659,139 S | 5/2012 | Gengler |
| 8,169,421 B2 | 5/2012 | Wright et al. |
| 8,179,236 B2 | 5/2012 | Weller et al. |
| 8,184,190 B2 | 5/2012 | Dosluoglu |
| 8,189,973 B2 | 5/2012 | Travis et al. |
| 8,216,074 B2 | 7/2012 | Sakuma |
| 8,229,509 B2 | 7/2012 | Paek et al. |
| 8,229,522 B2 | 7/2012 | Kim et al. |
| 8,231,099 B2 | 7/2012 | Chen |
| 8,248,791 B2 | 8/2012 | Wang et al. |
| 8,255,708 B1 | 8/2012 | Zhang |
| 8,264,310 B2 | 9/2012 | Lauder et al. |
| 8,267,368 B2 | 9/2012 | Torii et al. |
| 8,274,784 B2 | 9/2012 | Franz et al. |
| 8,279,589 B2 | 10/2012 | Kim |
| 8,310,768 B2 | 11/2012 | Lin et al. |
| 8,322,290 B1 | 12/2012 | Mignano |
| 8,342,857 B2 | 1/2013 | Palli et al. |
| 8,387,078 B2 | 2/2013 | Memmott |
| 8,416,559 B2 | 4/2013 | Agata et al. |
| 8,498,100 B1 | 7/2013 | Whitt, III et al. |
| 8,543,227 B1 | 9/2013 | Perek et al. |
| 8,548,608 B2 | 10/2013 | Perek et al. |
| 8,564,944 B2 | 10/2013 | Whitt, III et al. |
| 8,570,725 B2 | 10/2013 | Whitt, III et al. |
| 8,599,542 B1 | 12/2013 | Healey et al. |
| 8,610,015 B2 | 12/2013 | Whitt et al. |
| 8,614,666 B2 | 12/2013 | Whitman et al. |
| 8,646,999 B2 | 2/2014 | Shaw et al. |
| 8,699,215 B2 | 4/2014 | Whitt, III et al. |
| 8,719,603 B2 | 5/2014 | Belesiu |
| 8,724,302 B2 | 5/2014 | Whitt et al. |
| 2002/0044216 A1 | 4/2002 | Cha |
| 2002/0134828 A1 | 9/2002 | Sandbach et al. |
| 2002/0163510 A1 | 11/2002 | Williams et al. |
| 2003/0036365 A1 | 2/2003 | Kuroda |
| 2003/0163611 A1 | 8/2003 | Nagao |
| 2003/0165017 A1 | 9/2003 | Amitai |
| 2003/0197687 A1 | 10/2003 | Shetter |
| 2003/0198008 A1 | 10/2003 | Leapman et al. |
| 2004/0056843 A1 | 3/2004 | Lin et al. |
| 2004/0095333 A1 | 5/2004 | Morag et al. |
| 2004/0115994 A1 | 6/2004 | Wulff et al. |
| 2004/0156168 A1 | 8/2004 | LeVasseur et al. |
| 2004/0212601 A1 | 10/2004 | Cake et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0059489 A1 | 3/2005 | Kim |
| 2005/0099400 A1 | 5/2005 | Lee |
| 2005/0100690 A1 | 5/2005 | Mayer et al. |
| 2005/0134717 A1 | 6/2005 | Misawa |
| 2005/0146512 A1 | 7/2005 | Hill et al. |
| 2005/0264653 A1 | 12/2005 | Starkweather et al. |
| 2005/0264988 A1 | 12/2005 | Nicolosi |
| 2005/0285703 A1 | 12/2005 | Wheeler et al. |
| 2006/0028400 A1 | 2/2006 | Lapstun et al. |
| 2006/0049993 A1 | 3/2006 | Lin et al. |
| 2006/0085658 A1 | 4/2006 | Allen et al. |
| 2006/0102914 A1 | 5/2006 | Smits et al. |
| 2006/0125799 A1 | 6/2006 | Hillis et al. |
| 2006/0132423 A1 | 6/2006 | Travis |
| 2006/0154725 A1 | 7/2006 | Glaser et al. |
| 2006/0156415 A1 | 7/2006 | Rubinstein et al. |
| 2006/0181514 A1 | 8/2006 | Newman |
| 2006/0187216 A1 | 8/2006 | Trent, Jr. et al. |
| 2006/0195522 A1 | 8/2006 | Miyazaki |
| 2006/0227393 A1 | 10/2006 | Herloski |
| 2006/0238550 A1 | 10/2006 | Page |
| 2006/0279501 A1 | 12/2006 | Lu et al. |
| 2007/0003267 A1 | 1/2007 | Shibutani |
| 2007/0047221 A1 | 3/2007 | Park |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0081091 A1 | 4/2007 | Pan et al. |
| 2007/0145945 A1 | 6/2007 | McGinley et al. |
| 2007/0161262 A1 | 7/2007 | Lloyd |
| 2007/0176902 A1 | 8/2007 | Newman et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0188478 A1 | 8/2007 | Silverstein et al. |
| 2007/0200830 A1 | 8/2007 | Yamamoto |
| 2007/0201859 A1 | 8/2007 | Sarrat |
| 2007/0220708 A1 | 9/2007 | Lewis |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0247432 A1 | 10/2007 | Oakley |
| 2007/0260892 A1 | 11/2007 | Paul et al. |
| 2007/0274094 A1 | 11/2007 | Schultz et al. |
| 2007/0274095 A1 | 11/2007 | Destain |
| 2007/0283179 A1 | 12/2007 | Burnett et al. |
| 2008/0005423 A1 | 1/2008 | Jacobs et al. |
| 2008/0013809 A1 | 1/2008 | Zhu et al. |
| 2008/0053222 A1 | 3/2008 | Ehrensvard et al. |
| 2008/0059888 A1 | 3/2008 | Dunko |
| 2008/0068451 A1 | 3/2008 | Hyatt |
| 2008/0104437 A1 | 5/2008 | Lee |
| 2008/0106592 A1 | 5/2008 | Mikami |
| 2008/0122803 A1 | 5/2008 | Izadi et al. |
| 2008/0150913 A1 | 6/2008 | Bell et al. |
| 2008/0151478 A1 | 6/2008 | Chern |
| 2008/0158185 A1 | 7/2008 | Westerman |
| 2008/0167832 A1 | 7/2008 | Soss |
| 2008/0174570 A1 | 7/2008 | Jobs et al. |
| 2008/0182622 A1 | 7/2008 | Makarowski et al. |
| 2008/0219025 A1 | 9/2008 | Spitzer et al. |
| 2008/0225205 A1 | 9/2008 | Travis |
| 2008/0228969 A1 | 9/2008 | Cheah et al. |
| 2008/0238884 A1 | 10/2008 | Harish |
| 2008/0253822 A1 | 10/2008 | Matias |

(56) References Cited

U.S. PATENT DOCUMENTS

| | | |
|---|---|---|
| 2008/0309636 A1 | 12/2008 | Feng et al. |
| 2008/0316002 A1 | 12/2008 | Brunet et al. |
| 2008/0320190 A1 | 12/2008 | Lydon et al. |
| 2009/0009476 A1 | 1/2009 | Daley, III |
| 2009/0033623 A1 | 2/2009 | Lin |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0083562 A1 | 3/2009 | Park et al. |
| 2009/0096738 A1 | 4/2009 | Chen et al. |
| 2009/0127005 A1 | 5/2009 | Zachut et al. |
| 2009/0140985 A1 | 6/2009 | Liu |
| 2009/0163147 A1 | 6/2009 | Steigerwald et al. |
| 2009/0167728 A1 | 7/2009 | Geaghan et al. |
| 2009/0167930 A1 | 7/2009 | Safaee-Rad et al. |
| 2009/0189974 A1 | 7/2009 | Deering |
| 2009/0195497 A1 | 8/2009 | Fitzgerald et al. |
| 2009/0231275 A1 | 9/2009 | Odgers |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0285491 A1 | 11/2009 | Ravenscroft et al. |
| 2009/0296331 A1 | 12/2009 | Choy |
| 2009/0303137 A1 | 12/2009 | Kusaka et al. |
| 2009/0303204 A1 | 12/2009 | Nasiri et al. |
| 2009/0320244 A1 | 12/2009 | Lin |
| 2009/0321490 A1 | 12/2009 | Groene et al. |
| 2010/0001963 A1 | 1/2010 | Doray et al. |
| 2010/0013319 A1 | 1/2010 | Kamiyama et al. |
| 2010/0026656 A1 | 2/2010 | Hotelling et al. |
| 2010/0038821 A1 | 2/2010 | Jenkins et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0053534 A1 | 3/2010 | Hsieh et al. |
| 2010/0053771 A1 | 3/2010 | Travis et al. |
| 2010/0072351 A1 | 3/2010 | Mahowald |
| 2010/0077237 A1 | 3/2010 | Sawyers |
| 2010/0081377 A1 | 4/2010 | Chatterjee et al. |
| 2010/0085321 A1 | 4/2010 | Pundsack |
| 2010/0102182 A1 | 4/2010 | Lin |
| 2010/0102206 A1 | 4/2010 | Cazaux et al. |
| 2010/0103112 A1 | 4/2010 | Yoo et al. |
| 2010/0123686 A1 | 5/2010 | Klinghult et al. |
| 2010/0133398 A1 | 6/2010 | Chiu et al. |
| 2010/0142130 A1 | 6/2010 | Wang et al. |
| 2010/0149073 A1 | 6/2010 | Chaum et al. |
| 2010/0149111 A1 | 6/2010 | Olien |
| 2010/0149117 A1 | 6/2010 | Chien et al. |
| 2010/0149134 A1 | 6/2010 | Westerman et al. |
| 2010/0149377 A1 | 6/2010 | Shintani et al. |
| 2010/0156798 A1 | 6/2010 | Archer |
| 2010/0161522 A1 | 6/2010 | Tirpak et al. |
| 2010/0164857 A1 | 7/2010 | Liu et al. |
| 2010/0164897 A1 | 7/2010 | Morin et al. |
| 2010/0171891 A1 | 7/2010 | Kaji et al. |
| 2010/0174421 A1 | 7/2010 | Tsai et al. |
| 2010/0177388 A1 | 7/2010 | Cohen et al. |
| 2010/0180063 A1 | 7/2010 | Ananny et al. |
| 2010/0188299 A1 | 7/2010 | Rinehart et al. |
| 2010/0206614 A1 | 8/2010 | Park et al. |
| 2010/0206644 A1 | 8/2010 | Yeh |
| 2010/0214214 A1 | 8/2010 | Corson et al. |
| 2010/0214257 A1 | 8/2010 | Wussler et al. |
| 2010/0222110 A1 | 9/2010 | Kim et al. |
| 2010/0231498 A1 | 9/2010 | Large et al. |
| 2010/0231510 A1 | 9/2010 | Sampsell et al. |
| 2010/0231556 A1 | 9/2010 | Mines et al. |
| 2010/0235546 A1 | 9/2010 | Terlizzi et al. |
| 2010/0238075 A1 | 9/2010 | Pourseyed |
| 2010/0238138 A1 | 9/2010 | Goertz et al. |
| 2010/0238620 A1 | 9/2010 | Fish |
| 2010/0245221 A1 | 9/2010 | Khan |
| 2010/0250988 A1 | 9/2010 | Okuda et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0282953 A1 | 11/2010 | Tam |
| 2010/0289457 A1 | 11/2010 | Onnerud et al. |
| 2010/0295812 A1 | 11/2010 | Burns et al. |
| 2010/0296163 A1 | 11/2010 | Saarikko |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0315348 A1 | 12/2010 | Jellicoe et al. |
| 2010/0315774 A1 | 12/2010 | Walker et al. |
| 2010/0321339 A1 | 12/2010 | Kimmel |
| 2010/0321877 A1 | 12/2010 | Moser |
| 2010/0324457 A1 | 12/2010 | Bean et al. |
| 2010/0325155 A1 | 12/2010 | Skinner et al. |
| 2010/0331059 A1 | 12/2010 | Apgar et al. |
| 2011/0007047 A1 | 1/2011 | Fujioka et al. |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0032215 A1 | 2/2011 | Sirotich et al. |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0055407 A1 | 3/2011 | Lydon et al. |
| 2011/0060926 A1 | 3/2011 | Brooks et al. |
| 2011/0069148 A1 | 3/2011 | Jones et al. |
| 2011/0072391 A1 | 3/2011 | Hanggie et al. |
| 2011/0074688 A1 | 3/2011 | Hull et al. |
| 2011/0081946 A1 | 4/2011 | Singh |
| 2011/0096035 A1 | 4/2011 | Shen |
| 2011/0102326 A1 | 5/2011 | Casparian et al. |
| 2011/0102356 A1 | 5/2011 | Kemppinen et al. |
| 2011/0115747 A1 | 5/2011 | Powell et al. |
| 2011/0118025 A1 | 5/2011 | Lukas et al. |
| 2011/0122071 A1 | 5/2011 | Powell |
| 2011/0134032 A1 | 6/2011 | Chiu et al. |
| 2011/0134112 A1 | 6/2011 | Koh et al. |
| 2011/0157046 A1 | 6/2011 | Lee et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0169762 A1 | 7/2011 | Weiss |
| 2011/0169778 A1 | 7/2011 | Nungester et al. |
| 2011/0170289 A1 | 7/2011 | Allen et al. |
| 2011/0176035 A1 | 7/2011 | Poulsen |
| 2011/0179864 A1 | 7/2011 | Raasch et al. |
| 2011/0184646 A1 | 7/2011 | Wong et al. |
| 2011/0193787 A1 | 8/2011 | Morishige et al. |
| 2011/0193938 A1 | 8/2011 | Oderwald et al. |
| 2011/0202878 A1 | 8/2011 | Park et al. |
| 2011/0205372 A1 | 8/2011 | Miramontes |
| 2011/0216266 A1 | 9/2011 | Travis |
| 2011/0221659 A1 | 9/2011 | King et al. |
| 2011/0227913 A1 | 9/2011 | Hyndman |
| 2011/0228462 A1 | 9/2011 | Dang |
| 2011/0231682 A1 | 9/2011 | Kakish et al. |
| 2011/0242138 A1 | 10/2011 | Tribble |
| 2011/0242440 A1 | 10/2011 | Noma et al. |
| 2011/0242670 A1 | 10/2011 | Simmonds |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0261083 A1 | 10/2011 | Wilson |
| 2011/0267272 A1 | 11/2011 | Meyer et al. |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0298919 A1 | 12/2011 | Maglaque |
| 2011/0304577 A1 | 12/2011 | Brown |

(56) References Cited

U.S. PATENT DOCUMENTS

| | | |
|---|---|---|
| 2011/0304815 A1 | 12/2011 | Newell |
| 2011/0306424 A1 | 12/2011 | Kazama et al. |
| 2011/0310038 A1 | 12/2011 | Park et al. |
| 2011/0316807 A1 | 12/2011 | Corrion |
| 2012/0007821 A1 | 1/2012 | Zaliva |
| 2012/0011462 A1 | 1/2012 | Westerman et al. |
| 2012/0013519 A1 | 1/2012 | Hakansson et al. |
| 2012/0021618 A1 | 1/2012 | Schultz |
| 2012/0023459 A1 | 1/2012 | Westerman |
| 2012/0024682 A1 | 2/2012 | Huang et al. |
| 2012/0026048 A1 | 2/2012 | Vazquez et al. |
| 2012/0032891 A1 | 2/2012 | Parivar |
| 2012/0033369 A1 | 2/2012 | Wu et al. |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0062850 A1 | 3/2012 | Travis |
| 2012/0069540 A1 | 3/2012 | Lauder et al. |
| 2012/0071008 A1 | 3/2012 | Sessford |
| 2012/0075249 A1 | 3/2012 | Hoch |
| 2012/0081316 A1 | 4/2012 | Sirpal et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0113579 A1 | 5/2012 | Agata et al. |
| 2012/0115553 A1 | 5/2012 | Mahe et al. |
| 2012/0117409 A1 | 5/2012 | Lee et al. |
| 2012/0127118 A1 | 5/2012 | Nolting et al. |
| 2012/0140396 A1 | 6/2012 | Zeliff et al. |
| 2012/0145525 A1* | 6/2012 | Ishikawa ............ 200/512 |
| 2012/0162693 A1 | 6/2012 | Ito |
| 2012/0175487 A1 | 7/2012 | Goto |
| 2012/0182242 A1 | 7/2012 | Lindahl et al. |
| 2012/0182743 A1 | 7/2012 | Chou |
| 2012/0194393 A1 | 8/2012 | Utterman et al. |
| 2012/0194448 A1 | 8/2012 | Rothkopf |
| 2012/0200802 A1 | 8/2012 | Large |
| 2012/0206937 A1 | 8/2012 | Travis et al. |
| 2012/0223866 A1 | 9/2012 | Ayala Vazquez et al. |
| 2012/0224073 A1 | 9/2012 | Miyahara |
| 2012/0229634 A1 | 9/2012 | Laett et al. |
| 2012/0235635 A1 | 9/2012 | Sato |
| 2012/0243165 A1 | 9/2012 | Chang et al. |
| 2012/0246377 A1 | 9/2012 | Bhesania |
| 2012/0249443 A1 | 10/2012 | Anderson et al. |
| 2012/0256959 A1 | 10/2012 | Ye et al. |
| 2012/0274811 A1 | 11/2012 | Bakin |
| 2012/0300275 A1 | 11/2012 | Vilardell et al. |
| 2012/0312955 A1 | 12/2012 | Randolph |
| 2013/0009413 A1 | 1/2013 | Chiu et al. |
| 2013/0016468 A1 | 1/2013 | Oh |
| 2013/0017696 A1 | 1/2013 | Alvarez Rivera |
| 2013/0027867 A1 | 1/2013 | Lauder et al. |
| 2013/0044074 A1 | 2/2013 | Park et al. |
| 2013/0063873 A1 | 3/2013 | Wodrich et al. |
| 2013/0067126 A1 | 3/2013 | Casparian et al. |
| 2013/0076617 A1 | 3/2013 | Csaszar et al. |
| 2013/0088431 A1 | 4/2013 | Ballagas et al. |
| 2013/0106766 A1 | 5/2013 | Yilmaz et al. |
| 2013/0162554 A1 | 6/2013 | Lauder et al. |
| 2013/0172906 A1 | 7/2013 | Olson et al. |
| 2013/0207937 A1 | 8/2013 | Lutian et al. |
| 2013/0217451 A1 | 8/2013 | Komiyama et al. |
| 2013/0227836 A1 | 9/2013 | Whitt, III |
| 2013/0228023 A1 | 9/2013 | Drasnin |
| 2013/0228433 A1 | 9/2013 | Shaw |
| 2013/0228434 A1 | 9/2013 | Whitt, III |
| 2013/0228435 A1 | 9/2013 | Whitt, III |
| 2013/0229100 A1 | 9/2013 | Siddiqui |
| 2013/0229335 A1 | 9/2013 | Whitman |
| 2013/0229347 A1 | 9/2013 | Lutz, III |
| 2013/0229350 A1 | 9/2013 | Shaw |
| 2013/0229351 A1 | 9/2013 | Whitt, III |
| 2013/0229354 A1 | 9/2013 | Whitt, III |
| 2013/0229356 A1 | 9/2013 | Marwah |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229568 A1 | 9/2013 | Belesiu |
| 2013/0229570 A1 | 9/2013 | Beck et al. |
| 2013/0229756 A1 | 9/2013 | Whitt, III |
| 2013/0229757 A1 | 9/2013 | Whitt, III |
| 2013/0229758 A1 | 9/2013 | Belesiu |
| 2013/0229759 A1 | 9/2013 | Whitt, III |
| 2013/0229760 A1 | 9/2013 | Whitt, III |
| 2013/0229761 A1 | 9/2013 | Shaw |
| 2013/0229762 A1 | 9/2013 | Whitt, III |
| 2013/0229773 A1 | 9/2013 | Siddiqui |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0242495 A1 | 9/2013 | Bathiche et al. |
| 2013/0262886 A1 | 10/2013 | Nishimura |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0304944 A1 | 11/2013 | Young |
| 2013/0322000 A1 | 12/2013 | Whitt |
| 2013/0322001 A1 | 12/2013 | Whitt |
| 2013/0329360 A1 | 12/2013 | Aldana |
| 2013/0332628 A1 | 12/2013 | Panay |
| 2013/0339757 A1 | 12/2013 | Reddy |
| 2014/0012401 A1 | 1/2014 | Perek |
| 2014/0043275 A1 | 2/2014 | Whitman |
| 2014/0048399 A1 | 2/2014 | Whitt, III |
| 2014/0118241 A1 | 5/2014 | Chai |
| 2014/0119802 A1 | 5/2014 | Shaw |
| 2014/0132550 A1 | 5/2014 | McCracken et al. |

FOREIGN PATENT DOCUMENTS

| | | |
|---|---|---|
| EP | 1591891 | 11/2005 |
| EP | 2353978 | 8/2011 |
| GB | 2123213 | 1/1984 |
| JP | 56108127 | 8/1981 |
| JP | 10301055 | 11/1998 |
| JP | 10326124 | 12/1998 |
| JP | 1173239 | 3/1999 |
| JP | 2006294361 | 10/2006 |
| JP | 2009122551 | 6/2009 |
| KR | 20040066647 | 7/2004 |
| KR | 20110064265 | 6/2011 |
| KR | 1020110087178 | 8/2011 |
| WO | WO-9964784 | 12/1999 |
| WO | WO-0079327 | 12/2000 |
| WO | WO-2006044818 | 4/2006 |

OTHER PUBLICATIONS

"First One Handed Fabric Keyboard with Bluetooth Wireless Technology", Retrieved from: <http://press.xtvworld.com/article3817.html> on May 8, 2012,(Jan. 6, 2005), 2 pages.

"Force and Position Sensing Resistors: An Emerging Technology", *Interlink Electronics*, Available at <http://staff.science.uva.nl/~vlaander/docu/FSR/An_Exploring_Technology.pdf>,(Feb. 1990), pp. 1-6.

"Frogpad Introduces Weareable Fabric Keyboard with Bluetooth Technology", Retrieved from: <http://www.geekzone.co.nz/content.asp?contentid=3898> on May 7, 2012,(Jan. 7, 2005), 3 pages.

"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.

"Membrane Keyboards & Membrane Keypads", Retrieved from: <http://www.pannam.com/> on May 9, 2012,(Mar. 4, 2009), 2 pages.

(56) References Cited

OTHER PUBLICATIONS

"Motion Sensors", *Android Developers*, retrieved from <http://developer.android.com/guide/topics/sensors/sensors_motion.html> May 25, 2012, 7 pages.

"Position Sensors", *Android Developers*, retrieved from <http://developer.android.com/guide/topics/sensors/sensors_position.html> on May 25, 2012, 5 pages.

"SolRxTM E-Series Multidirectional Phototherapy ExpandableTM 2-Bulb Full Body Panel System", Retrieved from: < http://www.solarcsystems.com/us_multidirectional_uv_light_therapy_1_intro.html > on Jul. 25, 2012,(2011), 4 pages.

"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.

Block, Steve et al., "DeviceOrientation Event Specification", *W3C, Editor's Draft*, retrieved from <https://developer.palm.com/content/api/dev-guide/pdk/accessing-device-sensors.html> on May 25, 2012,(Jul. 12, 2011), 14 pages.

Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.

Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.

Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.

Dietz, Paul H., et al., "A Practical Pressure Sensitive Computer Keyboard", In Proceedings of UIST 2009,(Oct. 2009), 4 pages.

Glatt, Jeff "Channel and Key Pressure (Aftertouch).", Retrieved from: <http://home.roadrunner.com/~jgglatt/tutr/touch.htm> on Jun. 11, 2012, 2 pages.

Hanlon, Mike "ElekTex Smart Fabric Keyboard Goes Wireless", Retrieved from: <http://www.gizmag.com/go/5048/ > on May 7, 2012,(Jan. 15, 2006), 5 pages.

Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.

Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.

Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002), 5 pages.

McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.

Post, E.R. et al., "E-Broidery: Design and Fabrication of Textile-Based Computing", IBM Systems Journal, vol. 39, Issue 3 & 4,(Jul. 2000), pp. 840-860.

Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012), 15 pages.

Takamatsu, Seiichi et al., "Flexible Fabric Keyboard with Conductive Polymer-Coated Fibers", In Proceedings of Sensors 2011,(Oct. 28, 2011), 4 pages.

Zhang, et al., "Model-Based Development of Dynamically Adaptive Software", *In Proceedings of ICSE 2006*, Available at <http://www.irisa.fr/lande/lande/icse-proceedings/icse/p371.pdf>,(May 20, 2006), pp. 371-380.

"ACPI Docking for Windows Operating Systems", Retrieved from: <http://www.scritube.com/limba/engleza/software/ACPI-Docking-for-Windows-Opera331824193.php> on Jul. 6, 2012, 10 pages.

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, 1 page.

"Non-Final Office Action", U.S. Appl. No. 13/471,001, (Feb. 19, 2013), 15 pages.

"Non-Final Office Action", U.S. Appl. No. 13/471,202, (Feb. 11, 2013), 10 pages.

"Non-Final Office Action", U.S. Appl. No. 13/471,336, (Jan. 18, 2013), 14 pages.

"Non-Final Office Action", U.S. Appl. No. 13/651,195, (Jan. 2, 2013), 14 pages.

"Non-Final Office Action", U.S. Appl. No. 13/651,232, (Jan. 17, 2013), 15 pages.

"Non-Final Office Action", U.S. Appl. No. 13/651,272, (Feb. 12, 2013), 10 pages.

"Non-Final Office Action", U.S. Appl. No. 13/651,287, (Jan. 29, 2013), 13 pages.

"Non-Final Office Action", U.S. Appl. No. 13/651,871, (Mar. 18, 2013), 14 pages.

"Non-Final Office Action", U.S. Appl. No. 13/651,976, (Feb. 22, 2013), 16 pages.

"Non-Final Office Action", U.S. Appl. No. 13/653,321, (Feb. 1, 2013), 13 pages.

"Non-Final Office Action", U.S. Appl. No. 13/653,682, (Feb. 7, 2013), 11 pages.

"Restriction Requirement", U.S. Appl. No. 13/651,304, (Jan. 18, 2013), 7 pages.

"Restriction Requirement", U.S. Appl. No. 13/651,726, (Feb. 22, 2013), 6 pages.

"Restriction Requirement", U.S. Appl. No. 13/651,871, (Feb. 7, 2013), 6 pages.

"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, (Jun. 2012), 2 pages.

"Cholesteric Liquid Crystal", Retrieved from: <http://en.wikipedia.org/wiki/Cholesteric_liquid_crystal> on Aug. 6, 2012,(Jun. 10, 2012), 2 pages.

"Corrected Notice of Allowance", U.S. Appl. No. 13/470,633, (Apr. 9, 2013), 2 pages.

"Corrected Notice of Allowance", U.S. Appl. No. 13/470,633, (Jul. 2, 2013), 2 pages.

"DR2PA", retrieved from <http://www.architainment.co.uk/wp-content/uploads/2012/08/DR2PA-AU-US-size-Data-Sheet-Rev-H_LOGO.pdf> on Sep. 17, 2012, 4 pages.

"Final Office Action", U.S. Appl. No. 13/471,001, (Jul. 25, 2013), 20 pages.

"Final Office Action", U.S. Appl. No. 13/651,195, (Apr. 18, 2013), 13 pages.

"Final Office Action", U.S. Appl. No. 13/651,232, (May 21, 2013), 21 pages.

"Final Office Action", U.S. Appl. No. 13/651,287, (May 3, 2013), 16 pages.

"Final Office Action", U.S. Appl. No. 13/651,976, (Jul. 25, 2013), 21 pages.

"How to Use the iPad's Onscreen Keyboard", Retrieved from <http://www.dummies.com/how-to/content/how-to-use-the-ipads-onscreen-keyboard.html> on Aug. 28, 2012, 3 pages.

"i-Interactor electronic pen", Retrieved from: <http://www.alibaba.com/product-gs/331004878/i_Interactor_electronic_pen.html> on Jun. 19, 2012, 5 pages.

"MPC Fly Music Production Controller", *AKAI Professional*, Retrieved from: <http://www.akaiprompc.com/mpc-fly> on Jul. 9, 2012, 4 pages.

"NI Releases New Maschine & Maschine Mikro", Retrieved from <http://www.djbooth.net/index/dj-equipment/entry/ni-releases-new-maschine-mikro/> on Sep. 17, 2012, 19 pages.

"Non-Final Office Action", U.S. Appl. No. 13/527,263, (Jul. 19, 2013), 5 pages.

(56) References Cited

OTHER PUBLICATIONS

"Non-Final Office Action", U.S. Appl. No. 13/563,435, (Jun. 14, 2013), 6 pages.
"Non-Final Office Action", U.S. Appl. No. 13/564,520, (Jun. 19, 2013), 8 pages.
"Non-Final Office Action", U.S. Appl. No. 13/565,124, (Jun. 17, 2013), 5 pages.
"Non-Final Office Action", U.S. Appl. No. 13/651,304, (Mar. 22, 2013), 9 pages.
"Non-Final Office Action", U.S. Appl. No. 13/651,327, (Mar. 22, 2013), 6 pages.
"Non-Final Office Action", U.S. Appl. No. 13/651,726, (Apr. 15, 2013), 6 pages.
"Non-Final Office Action", U.S. Appl. No. 13/651,871, (Jul. 1, 2013), 5 pages.
"Non-Final Office Action", U.S. Appl. No. 13/653,682, (Jun. 3, 2013), 14 pages.
"Non-Final Office Action", U.S. Appl. No. 13/656,055, (Apr. 23, 2013), 11 pages.
"Non-Final Office Action", U.S. Appl. No. 13/656,520, (Feb. 1, 2013), 15 pages.
"Notice of Allowance", U.S. Appl. No. 13/470,633, (Mar. 22, 2013), 7 pages.
"Notice of Allowance", U.S. Appl. No. 13/471,202, (May 28, 2013), 7 pages.
"Notice of Allowance", U.S. Appl. No. 13/651,195, (Jul. 8, 2013), 9 pages.
"Notice of Allowance", U.S. Appl. No. 13/651,272, (May 2, 2013), 7 pages.
"Notice of Allowance", U.S. Appl. No. 13/651,304, (Jul. 1, 2013), 5 pages.
"Notice of Allowance", U.S. Appl. No. 13/651,327, (Jun. 11, 2013), 7 pages.
"Notice of Allowance", U.S. Appl. No. 13/651,726, (May 31, 2013), 5 pages.
"On-Screen Keyboard for Windows 7, Vista, XP with Touchscreen", Retrieved from <www.comfort-software.com/on-screen-keyboard.html> on Aug. 28, 2012, (Feb. 2, 2011), 3 pages.
"PCT Search Report and Written Opinion", Application No. PCT/US2013/029461, (Jun. 21, 2013), 11 pages.
"PCT Search Report and Written Opinion", Application No. PCT/US2013/028948, (Jun. 21, 2013), 11 pages.
"Reflex LCD Writing Tablets", retrieved from <http://www.kentdisplays.com/products/lcdwritingtablets.html> on Jun. 27, 2012, 3 pages.
"SMART Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>,(2009), 2 pages.
"Tilt Shift Lenses: Perspective Control", retrieved from http://www.cambridgeincolour.com/tutorials/tilt-shift-lenses1.htm, (Mar. 28, 2008), 11 Pages.
"What is Active Alignment?", http://www.kasalis.com/active_alignment.html, retrieved on Nov. 22, 2012, 2 Pages.
Das, Apurba et al., "Study of Heat Transfer through Multilayer Clothing Assemblies: A Theoretical Prediction", Retrieved from <http://www.autexrj.com/cms/zalaczone_pliki/5_013_11.pdf>, (Jun. 2011), 7 pages.
Iwase, Eiji "Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> Proceedings: Journal of Microelectromechanical Systems, (Dec. 2005), 7 pages.
Li, et al., "Characteristic Mode Based Tradeoff Analysis of Antenna-Chassis Interactions for Multiple Antenna Terminals", In IEEE Transactions on Antennas and Propagation, Retrieved from <http://ieeexplore.ieee.org/stamp/stamp.jsp?tp=&arnumber=6060882>,(Feb. 2012), 13 pages.
Piltch, Avram "ASUS Eee Pad Slider SL101 Review", Retrieved from <http://www.laptopmag.com/review/tablets/asus-eee-pad-slider-sl101.aspx>, (Sep. 22, 2011), 5 pages.
Qin, Yongqiang et al., "pPen: Enabling Authenticated Pen and Touch Interaction on Tabletop Surfaces", In Proceedings of ITS 2010, Available at <http://www.dfki.de/its2010/papers/pdf/po172.pdf>,(Nov. 2010), pp. 283-284.
Sumimoto, Mark "Touch & Write: Surface Computing With Touch and Pen Input", Retrieved from: <http://www.gottabemobile.com/2009/08/07/touch-write-surface-computing-with-touch-and-pen-input/> on Jun. 19, 2012,(Aug. 7, 2009), 4 pages.
Valliath, G T., "Design of Hologram for Brightness Enhancement in Color LCDs", Retrieved from <http://www.loreti.it/Download/PDF/LCD/44_05.pdf> on Sep. 17, 2012, 5 pages.
Williams, Jim "A Fourth Generation of LCD Backlight Technology", Retrieved from <http://cds.linear.com/docs/Application%20Note/an65f.pdf>, (Nov. 1995), 124 pages.
"Advanced Configuration and Power Management Specification", Intel Corporation, Microsoft Corporation, Toshiba Corp. Revision 1, (Dec. 22, 1996), 364 pages.
"Corrected Notice of Allowance", U.S. Appl. No. 13/651,327, (Sep. 12, 2013), 2 pages.
"Corrected Notice of Allowance", U.S. Appl. No. 13/651,327, (Sep. 23, 2013), 2 pages.
"Corrected Notice of Allowance", U.S. Appl. No. 13/651,726, (Sep. 17, 2013), 2 pages.
"Final Office Action", U.S. Appl. No. 13/471,336, (Aug. 28, 2013), 18 pages.
"Final Office Action", U.S. Appl. No. 13/653,321, (Aug. 2, 2013), 17 pages.
"Final Office Action", U.S. Appl. No. 13/653,682, (Oct. 18, 2013), 16 pages.
"Final Office Action", U.S. Appl. No. 13/656,055, (Oct. 23, 2013), 14 pages.
"Non-Final Office Action", U.S. Appl. No. 13/938,930, (Aug. 29, 2013), 9 pages.
"Non-Final Office Action", U.S. Appl. No. 13/939,002, (Aug. 28, 2013), 6 pages.
"Non-Final Office Action", U.S. Appl. No. 13/939,032, (Aug. 29, 2013), 7 pages.
"Notice of Allowance", U.S. Appl. No. 13/651,871, (Oct. 2, 2013), 7 pages.
"Notice to Grant", Chinese Application No. 201320097089.9, (Sep. 29, 2013), 2 Pages.
"PCT Search Report and Written Opinion", Application No. PCT/US2013/040968, (Sep. 5, 2013), 12 pages.
"PCT Search Report and Written Opinion", Application No. PCT/US2013/045049, (Sep. 16, 2013), 9 pages.
"Final Office Action", U.S. Appl. No. 13/938,930, Nov. 8, 2013, 10 pages.
"Final Office Action", U.S. Appl. No. 13/939,032, Dec. 20, 2013, 5 pages.
"Final Office Action", U.S. Appl. No. 13/939,002, Nov. 8, 2013, 7 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"Non-Final Office Action", U.S. Appl. No. 14/063,912, Jan. 2, 2014, 10 pages.
"Non-Final Office Action", U.S. Appl. No. 13/780,228, Oct. 30, 2013, 12 pages.
"Non-Final Office Action", U.S. Appl. No. 13/651,232, Dec. 5, 2013, 15 pages.
"Non-Final Office Action", U.S. Appl. No. 13/468,918, Dec. 26, 2013, 18 pages.
"Non-Final Office Action", U.S. Appl. No. 13/939,002, Dec. 20, 2013, 5 pages.
"Notice of Allowance", U.S. Appl. No. 13/653,321, Dec. 18, 2013, 41 pages.
"Notice of Allowance", U.S. Appl. No. 13/563,435, Nov. 12, 2013, 5 pages.

(56) References Cited

OTHER PUBLICATIONS

"Notice of Allowance", U.S. Appl. No. 13/565,124, Dec. 24, 2013, 6 pages.
"Notice to Grant", CN Application No. 201320097124.7, Oct. 8, 2013, 2 pages.
"Restriction Requirement", U.S. Appl. No. 13/468,918, Nov. 29, 2013, 6 pages.
"Corrected Notice of Allowance", U.S. Appl. No. 13/563,435, Jan. 14, 2014, 2 pages.
"Corrected Notice of Allowance", U.S. Appl. No. 13/563,435, Jan. 22, 2014, 2 pages.
"Directional Backlighting for Display Panels", U.S. Appl. No. 13/021,448, Feb. 4, 2011, 38 pages.
"Foreign Office Action", CN Application No. 201320097066.8, Oct. 24, 2013, 5 Pages.
"Final Office Action", U.S. Appl. No. 13/564,520, Jan. 15, 2014, 7 pages.
"Non-Final Office Action", U.S. Appl. No. 13/656,520, Jun. 5, 2013, 8 pages.
"Non-Final Office Action", U.S. Appl. No. 13/021,448, Dec. 13, 2012, 9 pages.
"Optical Sensors in Smart Mobile Devices", ON Semiconductor, TND415/D, Available at <http://www.onsemi.jp/pub_link/Collateral/TND415-D.PDF>, Nov. 2010, pp. 1-13.
"Developing Next-Generation Human Interfaces using Capacitive and Infrared Proximity Sensing", Silicon Laboratories, Inc., Available at <http://www.silabs.com/pages/DownloadDoc.aspx?FILEURL=support%20documents/technicaldocs/capacitive%20and%20proximity%20sensing_wp.pdf&src=SearchResults>,Aug. 30, 2010, pp. 1-10.
"Optics for Displays: Waveguide-based Wedge Creates Collimated Display Backlight", OptoIQ, retrieved from <http://www.optoiq.com/index/photonics-technologies-applications/lfw-display/lfw-article-display.articles.laser-focus-world.volume-46.issue-1.world-news.optics-for_displays.html> on Nov. 2, 2010, Jan. 1, 2010, 3 pages.
Gaver, et al.,"A Virtual Window on Media Space", retrieved from <http://www.gold.ac.uk/media/15gaver-smets-overbeeke.MediaSpaceWindow.chi95.pdf> on Jun. 1, 2012, retrieved from <http://www.gold.ac.uk/media/15gaver-smets-overbeeke.MediaSpaceWindow.chi95.pdf> on Jun. 1, 2012,May 7, 1995, 9 pages.
Harada, et al.,"VoiceDraw: A Hands-Free Voice-Driven Drawing Application for People With Motor Impairments", In Proceedings of Ninth International ACM SIGACCESS Conference on Computers and Accessibility, retrieved from <http://citeseerx.ist.psu.edu/viewdoc/download?doi=10.1.1.113.7211&rep=rep1&type=pdf> on Jun. 1, 2012,Oct. 15, 2007, 8 pages.
Hinckley, et al.,"Codex: A Dual Screen Tablet Computer", Conference on Human Factors in Computing Systems, Apr. 9, 2009, 10 pages.
Kaufmann, et al.,"Hand Posture Recognition Using Real-time Artificial Evolution", EvoApplications'09, retrieved from <http://evelyne.lutton.free.fr/Papers/KaufmannEvolASP2010.pdf> on Jan. 5, 2012,Apr. 3, 2010, 10 pages.
Manresa-Yee, et al.,"Experiences Using a Hands-Free Interface", In Proceedings of the 10th International AMC SIGACCESS Conference on Computers and Accessibility, retrieved from <http://dmi.uib.es/~cmanresay/Research/%5BMan08%5DAssets08.pdf> on Jun. 1, 2012,Oct. 13, 2008, pp. 261-262.
Nakanishi, et al.,"Movable Cameras Enhance Social Telepresence in Media Spaces", In Proceedings of the 27th International Conference on Human Factors in Computing Systems, retrieved from <http://smg.ams.eng.osaka-u.ac.jp/~nakanishi/hnp_2009_chi.pdf> on Jun. 1, 2012,Apr. 6, 2009, 10 pages.
Reilink, et al.,"Endoscopic Camera Control by Head Movements for Thoracic Surgery", In Proceedings of 3rd IEEE RAS & EMBS International Conference of Biomedical Robotics and Biomechatronics, retrieved from <http://doc.utwente.nl/74929/1/biorob_online.pdf> on Jun. 1, 2012,Sep. 26, 2010, pp. 510-515.

Sundstedt, "Gazing at Games: Using Eye Tracking to Control Virtual Characters", In ACM SIGGRAPH 2010 Courses, retrieved from <http://www.tobii.com/Global/Analysis/Training/EyeTrackAwards/veronica_sundstedt.pdf> on Jun. 1, 2012,Jul. 28, 2010, 85 pages.
Travis, et al.,"The Design of Backlights for View-Sequential 3D", retrieved from <http://download.microsoft.com/download/D/2/E/D2E425F8-CF3C-4C71-A4A2-70F9D4081007/Backlightforviewsequentialautostereo.docx> on Nov. 1, 2010, 4 pages.
Travis, et al.,"Collimated Light from a Waveguide for a Display Backlight", Optics Express, 19714, vol. 17, No. 22, retrieved from <http://download.microsoft.com/download/D/2/E/D2E425F8-CF3C-4C71-A4A2-70F9D4081007/OpticsExpressbacklightpaper.pdf> on Oct. 15, 2009,Oct. 15, 2009, 6 pages.
Valli, "Notes on Natural Interaction", retrieved from <http://www.idemployee.id.tue.nl/g.w.m.rauterberg/lecturenotes/valli-2004.pdf> on Jan. 5, 2012,Sep. 2005, 80 pages.
Vaucelle, "Scopemate, A Robotic Microscope!", Architectradure, retrieved from <http://architectradure.blogspot.com/2011/10/at-uist-this-monday-scopemate-robotic.html> on Jun. 6, 2012,Oct. 17, 2011, 2 pages.
Xu, et al.,"Vision-based Detection of Dynamic Gesture", ICTM'09, Dec. 5-6, 2009, retrieved from <http://ieeexplore.ieee.org/stamp/stamp.jsp?tp=&arnumber=5412956> on Jan. 5, 2012,Dec. 5, 2009, pp. 223-226.
Xu, et al.,"Hand Gesture Recognition and Virtual Game Control Based on 3D Accelerometer and EMG Sensors", IUI'09, Feb. 8-11, 2009, retrieved from <http://sclab.yonsei.ac.kr/courses/10TPR/10TPR.files/Hand%20Gesture%20Recognition%20and%20Virtual%20Game%20Control%20based%20on%203d%20accelerometer%20and%20EMG%20sensors.pdf> on Jan. 5, 2012,Feb. 8, 2009, 5 pages.
Zhu, et al.,"Keyboard before Head Tracking Depresses User Success in Remote Camera Control", In Proceedings of 12th IFIP TC 13 International Conference on Human-Computer Interaction, Part II, retrieved from <http://csiro.academia.edu/Departments/CSIRO_ICT_Centre/Papers?page=5> on Jun. 1, 2012,Aug. 24, 2009, 14 pages.
"Advisory Action", U.S. Appl. No. 13/939,032, Feb. 24, 2014, 2 pages.
"Corrected Notice of Allowance", U.S. Appl. No. 13/563,435, Mar. 20, 2014, 2 pages.
"Corrected Notice of Allowance", U.S. Appl. No. 13/565,124, Apr. 3, 2014, 4 pages.
"Corrected Notice of Allowance", U.S. Appl. No. 13/565,124, Mar. 10, 2014, 2 pages.
"Corrected Notice of Allowance", U.S. Appl. No. 13/565,124, Apr. 14, 2014, 2 pages.
"Corrected Notice of Allowance", U.S. Appl. No. 13/938,930, May 6, 2014, 2 pages.
"Corrected Notice of Allowance", U.S. Appl. No. 13/939,002, May 5, 2014, 2 pages.
"Final Office Action", U.S. Appl. No. 13/780,228, Mar. 28, 2014, 13 pages.
"Final Office Action", U.S. Appl. No. 14/063,912, Apr. 29, 2014, 10 pages.
"Final Office Action", U.S. Appl. No. 14/199,924, May 6, 2014, 5 pages.
"Foreign Office Action", CN Application No. 201320328022.1, Feb. 17, 2014, 4 Pages.
"International Search Report and Written Opinion", Application No. PCT/US2013/067905, Apr. 15, 2014, 9 pages.
"Non-Final Office Action", U.S. Appl. No. 13/599,635, Feb. 25, 2014, 13 pages.
"Non-Final Office Action", U.S. Appl. No. 13/471,186, Feb. 27, 2014, 8 pages.
"Non-Final Office Action", U.S. Appl. No. 13/471,237, Mar. 24, 2014, 7 pages.
"Non-Final Office Action", U.S. Appl. No. 13/471,336, May 7, 2014, 17 pages.
"Non-Final Office Action", U.S. Appl. No. 13/471,376, Apr. 2, 2014, 17 pages.

(56) References Cited

OTHER PUBLICATIONS

"Non-Final Office Action", U.S. Appl. No. 13/471,405, Feb. 20, 2014, 37 pages.
"Non-Final Office Action", U.S. Appl. No. 13/492,232, Apr. 30, 2014, 9 pages.
"Non-Final Office Action", U.S. Appl. No. 13/527,263, Apr. 3, 2014, 6 pages.
"Non-Final Office Action", U.S. Appl. No. 13/564,520, Feb. 14, 2014, 5 pages.
"Non-Final Office Action", U.S. Appl. No. 13/645,405, Jan. 31, 2014, 6 pages.
"Non-Final Office Action", U.S. Appl. No. 13/653,682, Feb. 26, 2014, 10 pages.
"Non-Final Office Action", U.S. Appl. No. 13/656,055, Mar. 12, 2014, 17 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Notice of Allowance", U.S. Appl. No. 13/471,237, May 12, 2014, 8 pages.
"Notice of Allowance", U.S. Appl. No. 13/651,232, Apr. 25, 2014, 9 pages.
"Notice of Allowance", U.S. Appl. No. 13/651,287, May 2, 2014, 6 pages.
"Notice of Allowance", U.S. Appl. No. 13/938,930, Feb. 20, 2014, 4 pages.
"Notice of Allowance", U.S. Appl. No. 13/939,002, Mar. 3, 2014, 4 pages.
"Notice of Allowance", U.S. Appl. No. 13/939,032, Apr. 3, 2014, 4 pages.
"Supplemental Notice of Allowance", U.S. Appl. No. 13/653,321, Mar. 28, 2014, 4 pages.
"Advisory Action", U.S. Appl. No. 14/199,924, May 28, 2014, 2 pages.
"Corrected Notice of Allowance", U.S. Appl. No. 13/938,930, Jun. 6, 2014, 2 pages.
"Corrected Notice of Allowance", U.S. Appl. No. 13/939,002, May 22, 2014, 2 pages.
"Final Office Action", U.S. Appl. No. 13/653,682, Jun. 11, 2014, 11 pages.
"International Search Report and Written Opinion", Application No. PCT/US2014/013928, May 12, 2014, 17 pages.
"Non-Final Office Action", U.S. Appl. No. 13/471,030, May 15, 2014, 10 pages.
"Non-Final Office Action", U.S. Appl. No. 13/471,054, Jun. 3, 2014, 15 pages.
"Non-Final Office Action", U.S. Appl. No. 13/564,520, Jun. 16, 2014, 5 pages.
"Non-Final Office Action", U.S. Appl. No. 13/651,976, Jun. 16, 2014, 23 pages.
"Non-Final Office Action", U.S. Appl. No. 14/225,250, Jun. 17, 2014, 5 pages.
"Non-Final Office Action", U.S. Appl. No. 14/225,276, Jun. 13, 2014, 6 pages.
"Non-Final Office Action", U.S. Appl. No. 14/277,240, Jun. 13, 2014, 6 pages.
"Notice of Allowance", U.S. Appl. No. 13/468,918, Jun. 17, 2014, 5 pages.
"Notice of Allowance", U.S. Appl. No. 14/018,286, May 23, 2014, 8 pages.
"Notice of Allowance", U.S. Appl. No. 14/199,924, Jun. 10, 2014, 4 pages.
"Restriction Requirement", U.S. Appl. No. 13/595,700, May 28, 2014, 6 pages.
"Supplemental Notice of Allowance", U.S. Appl. No. 14/018,286, Jun. 11, 2014, 5 pages.
"Apple®—45W MagSafe 2 Power Adapter with Magnetic DC Connector-", Retrieved from <http://www.bestbuy.com/site/Apple%26%23174%3B---45W-MagSafe-2-Power-Adapter-with-Magnetic-DC-Connector/5856526.p?id=1218696408860&skuId=5856526#tab=overview> on May 14, 2013, 2013, 4 Pages.
"For Any Kind of Proceeding 2011 Springtime as Well as Coil Nailers as Well as Hotter Summer Season", Lady Shoe Worlds, retrieved from <http://www.ladyshoesworld.com/2011/09/18/for-any-kind-of-proceeding-2011-springtime-as-well-as-coil-nailers-as-well-as-hotter-summer-season/> on Nov. 3, 2011, Sep. 8, 2011, 2 pages.
"Foreign Office Action", CN Application No. 201320328022.1, Oct. 18, 2013, 3 Pages.
"iControlPad 2—The open source controller", Retrieved from <http://www.kickstarter.com/projects/1703567677/icontrolpad-2-the-open-source-controller> on Nov. 20, 2012, 2012, 15 pages.
"International Search Report and Written Opinion", Application No. PCT/US2013/028479, Jun. 17, 2013, 10 pages.
"International Search Report and Written Opinion", Application No. PCT/US2011/050471, Apr. 9, 2012, 8 pages.
"Microsoft Develops Glasses-Free Eye-Tracking 3D Display", Tech-FAQ—retrieved from <http://www.tech-faq.com/microsoft-develops-glasses-free-eye-tracking-3d-display.html> on Nov. 2, 2011, 3 pages.
"Microsoft Reveals Futuristic 3D Virtual HoloDesk Patent", Retrieved from <http://www.patentbolt.com/2012/05/microsoft-reveals-futuristic-3d-virtual-holodesk-patent.htmlt> on May 28, 2012, May 23, 2012, 9 pages.
"Molex: PCI Express Mini Card Connector, Right Angle, Low-Profile, Mid-Mount 0.80mm (.031") Pitch", Retrieved from <http://rhu004.sma-promail.com/SQLImages/kelmscott/Molex/PDF_Images/987650-4441.PDF> on Feb. 6, 2013, 2010, 3 pages.
"Non-Final Office Action", U.S. Appl. No. 12/882,994, Feb. 1, 2013, 17 pages.
"Non-Final Office Action", U.S. Appl. No. 13/371,725, Nov. 7, 2013, 19 pages.
"PCI Express® SMT Connector | FCI", Retrieved from <http://www.ttiinc.com/object/fp_fci_PCISMT> on Feb. 6, 2013, Feb. 2013, 1 page.
"RoPD® Connectors", Retrieved from <http://www.rosenberger.de/documents/headquarters_de_en/ba_automotive/AUTO_RoPD_Flyer_2012.pdf> on May 14, 2013, Jun. 2012, 6 pages.
Bert, et al., "Passive Matrix Addressing of Electrophoretic Image Display", Conference on International Display Research Conference, Retrieved from <http://www.cmst.be/publi/eurodisplay2002_s14-1.pdf>, Oct. 1, 2002, 4 pages.
Breath, "ThinkSafe: A Magnetic Power Connector for Thinkpads", Retrieved from <http://www.instructables.com/id/ThinkSafe%3A-A-Magnetic-Power-Connector-for-Thinkpad/> on May 14, 2013, Oct. 26, 2006, 9 pages.
Burge, et al., "Determination of off-axis aberrations of imaging systems using on-axis measurements", SPIE Proceeding, Retrieved from <http://www.loft.optics.arizona.edu/documents/journal_articles/Jim_Burge_Determination_of_off-axis_aberrations_of_imaging_systems_using_on-axis_measurements.pdf>, Sep. 21, 2011, 10 pages.
Chang, et al., "Optical Design and Analysis of LCD Backlight Units Using ASAP", Optical Engineering, Available at <http://www.opticsvalley.com/resources/kbasePDF/ma_oe_001_optical_design.pdf>, Jun. 2003, 15 pages.
Diverdi, et al., "An Immaterial Pseudo-3D Display with 3D Interaction", In the proceedings of Three-Dimensional Television: Capture, Transmission, and Display, Springer, Retrieved from <http://www.cs.ucsb.edu/~holl/pubs/DiVerdi-2007-3DTV.pdf>, Feb. 6, 2007, 26 pages.
Grossman, et al., "Multi-Finger Gestural Interaction with 3D Volumetric Displays", In the proceedings of the 17th annual ACM symposium on User interface software and technology, Retrieved from <http://www.dgp.toronto.edu/papers/tgrossman_UIST2004.pdf>, Oct. 24, 2004, 61-70.
Izadi, et al., "ThinSight: A Thin Form-Factor Interactive Surface Technology", Communications of the ACM, vol. 52, No. 12, retrieved from <http://research.microsoft.com/pubs/132532/p90-izadi.pdf> on Jan. 5, 2012, Dec. 2009, pp. 90-98.
Jacobs, et al., "2D/3D Switchable Displays", In the proceedings of Sharp Technical Journal (4), Available at <https://cgi.sharp.co.jp/corporate/rd/journal-85/pdf/85-04.pdf>, Apr. 2003, pp. 15-18.

(56) References Cited

OTHER PUBLICATIONS

Lee, "Flat-Panel Autostereoscopic 3D Display", Optoelectronics, IET, Available at <http://ieeexplore.ieee.org/stamp/stamp.jsp?arnumber=04455550>, Feb. 2008, pp. 24-28.

Lee, et al., "Depth-Fused 3D Imagery on an Immaterial Display", In the proceedings of IEEE Transactions On Visualization And Computer Graphics, vol. 15, No. 1, Retrieved from <http://ieeexplore.ieee.org/stamp/stamp.jsp?arnumber=04540094>, Jan. 2009, 20-33.

Lee, et al., "LED Light Coupler Design for a Ultra Thin Light Guide", Journal of the Optical Society of Korea, vol. 11, Issue.3, Retrieved from <http://opticslab.kongju.ac.kr/pdf/06.pdf>, Sep. 2007, 5 pages.

Liu, et al., "Three-dimensional PC: toward novel forms of human-computer interaction", In the proceedings of Three-Dimensional Video and Display: Devices and Systems vol. CR76, Retrieved from <http://www.google.co.in/url?sa=t&rct=j&q=Three-dimensional+PC:+toward+novel+forms+of+human-computer+interaction&source=web&cd=1&ved=0CFoQFjAA&url=http%3A%2F%2Fciteseerx.ist.psu.edu%2Fviewdoc%2Fdownload%3Fdoi%3D10.1.1.32.9469%26rep%3Drep1%26>, Nov. 5, 2000, 250-281.

Mclellan, "Microsoft Surface Review", Retrieved from <http://www.zdnet.com/microsoft-surface-review-7000006968/> on May 13, 2013, Nov. 6, 2012, 17 pages.

Miller, "MOGA gaming controller enhances the Android gaming experience", Retrieved from <http://www.zdnet.com/moga-gaming-controller-enhances-the-android-gaming-experience-7000007550/> on Nov. 20, 2012, Nov. 18, 2012, 9 pages.

Morookian, et al., "Ambient-Light-Canceling Camera Using Subtraction of Frames", NASA Tech Briefs, Retrieved from <http://ntrs.nasa.gov/archive/nasa/casi.ntrs.nasa.gov/20110016693_2011017808.pdf>, May 2004, 2 pages.

Peli, "Visual and Optometric Issues with Head-Mounted Displays", IS & T/OSA Optics & Imaging in the Information Age, The Society for Imaging Science and Technology, available at <http://www.u.arizona.edu/~zrui3/zhang_pHMPD_spie07.pdf>, 1996, pp. 364-369.

Reisman, et al., "A Screen-Space Formulation for 2D and 3D Direct Manipulation", In the proceedings of the 22nd annual ACM symposium on User interface, Retrieved from <http://innovis.cpsc.ucalgary.ca/innovis/uploads/Courses/TableTopDetails2009/Reisman2009.pdf>, Oct. 4, 2009, 69-78.

Schoning, et al., "Building Interactive Multi-Touch Surfaces", Journal of Graphics, GPU, and Game Tools, vol. 14, No. 3, available at <http://www.libavg.com/raw-attachment/wiki/Multitouch/Multitouchguide_draft.pdf>, Nov. 2009, pp. 35-55.

Staff, "Gametel Android controller turns tablets, phones into portable gaming devices", Retrieved from <http://www.mobiletor.com/2011/11/18/gametel-android-controller-turns-tablets-phones-into-portable-gaming-devices/#> on Nov. 20, 2012, Nov. 18, 2011, 5 pages.

Travis, et al., "Flat Projection for 3-D", In Proceedings of the IEEE, vol. 94 Issue: 3, Available at <http://ieeexplore.ieee.org/stamp/stamp.jsp?tp=&arnumber=1605201>, Mar. 13, 2006, pp. 539-549.

Yan, et al., "Edge-Lighting Light Guide Plate Based on Micro-Prism for Liquid Crystal Display", Journal of Display Technology, vol. 5, No. 9, Available at <http://ieeexplore.ieee.org/ielx5/9425/5196834/05196835.pdf?tp=&arnumber=5196835&isnumber=5196834>, Sep. 2009, pp. 355-357.

Yu, et al., "A New Driving Scheme for Reflective Bistable Cholesteric Liquid Crystal Displays", Society for Information Display International Symposium Digest of Technical Papers, Retrieved from <http://www.ee.ust.hk/~eekwok/publications/1997/bcd_sid.pdf>, May 1997, 4 pages.

Zhang, "Design of Head Mounted Displays", Retrieved at <<http://www.optics.arizona.edu/optomech/student%20reports/2007/Design%20of%20mounteddisplays%20Zhang.pdf>>, Dec. 12, 2007, 6 pages.

* cited by examiner

INPUT DEVICE SECURING TECHNIQUES

RELATED APPLICATIONS

This application claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional;"

and further this application incorporates the following applications by reference in their entirety:

U.S. patent application Ser. No. 13/470,633, filed May 14, 2012, and titled "Flexible Hinge and Removable Attachment;"

U.S. patent application Ser. No. 13/471,282, filed May 14, 2012, and titled "Input Device Assembly."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on. However, traditional mobile computing devices often employed a virtual keyboard that was accessed using touchscreen functionality of the device. This was generally employed to maximize an amount of display area of the computing device.

Use of the virtual keyboard, however, could be frustrating to a user that desired to provide a significant amount of inputs, such as to enter a significant amount of text to compose a long email, document, and so forth. Thus, conventional mobile computing devices were often perceived to have limited usefulness for such tasks, especially in comparison with ease at which users could enter text using a conventional keyboard, e.g., of a conventional desktop computer. Use of the conventional keyboards, though, with the mobile computing device could decrease the mobility of the mobile computing device and thus could make the mobile computing device less suited for its intended use in mobile settings.

SUMMARY

Input device securing techniques are described. In one or more implementations, a pressure sensitive key includes a sensor substrate having one or more conductors, a spacer layer, and a flexible contact layer. The spacer layer is disposed proximal to the sensor substrate and has at least one opening that exposes the one or more conductors of the sensor substrate, the opening defining a plurality of edges of the pressure sensitive key. The flexible contact layer is spaced apart from the sensor substrate by the spacer layer and configured to flex through the opening in response to an applied pressure to contact the one or more conductors of the sensor substrate to initiate an input. The flexible contact layer is secured to the spacer layer such that at a first edge, the flexible contact layer is secured to the spacer layer at an approximate midpoint of the first edge and is not secured to the spacer along another portion of the first edge and at a second edge, the flexible contact layer is not secured to the spacer layer along an approximate midpoint of the second edge.

In one or more implementations, an input device includes a sensor substrate having a first set of one or more conductors of a first pressure sensitive key and a second set of one or more conductors of a second pressure sensitive key, a spacer layer disposed proximal to the sensor substrate and having first and second openings that expose the first and second sets of conductors, respectively, and a flexible contact layer spaced apart from the sensor substrate by the spacer layer. The flexible contact layer is configured to flex through the first and second openings responsive to an applied pressure to contact, respectively, the first and second sets of conductors to initiate respective first and second inputs. An arrangement of adhesive that secures the flexible contact layer to the spacer layer along one or more edges of the first pressure sensitive key is different than an arrangement of adhesive that secures the flexible contact layer to the spacer layer along one or more edges of the second pressure sensitive key.

In one or more implementations, an input device includes a sensor substrate having a plurality of sets of one or more conductors of a respective plurality of pressure sensitive keys, a spacer layer disposed proximal to the sensor substrate and having a plurality of openings that expose the plurality of sets of conductors, respectively, a flexible contact layer, and a press equalization device. The flexible contact layer is spaced apart from the sensor substrate by the spacer layer and configured to flex through the plurality of openings responsive to respective applied pressures to respective sets of conductors to initiate respective inputs. The pressure equalization device is formed as a series of connected channels that connect one or more of the plurality of openings to an outside area of the input device to permit air pressure of the outside area to generally equalize with air pressure within the one or more of the plurality of openings.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Pressure sensitive keys may be used as part of an input device to support a relatively thin form factor, such as approximately three millimeters. However, pressure sensitive keys may not provide a degree of feedback that is common with conventional mechanical keyboards and therefore may result in missed hits and partial hits to intended keys of the keyboard. Further, conventional configuration of the pressure sensitive keys often resulted in different sensitivities due to the flexibility of the material being deflected, e.g., greater deflection is generally observed at a central area of the key as opposed to an edge of the key. Therefore, conventional pressure sensitive keys could result in an inconsistent user experience with a device that employs the keys.

Input device securing techniques are described. In one or more implementations, a pressure sensitive key is configured to provide a normalized output, e.g., to counteract differences in the flexibility at different positions of the pressure sensitive key. For example, sensitivity at an edge of a key may be increased in comparison with the sensitivity at a center of the key to address the differences in flexibility of the key at those positions.

The sensitivity may be adjusted in a variety of ways. For example, sensitivity may be adjusted by arrangement of support structure and/or adhesives used to secure a flexible contact layer to a spacer layer. This may be used to alter flexibility along different locations along an edge of the key. Sensitivity may also be adjusted for different keys. For example, depending on a location on a keyboard, different keys may be pressed using different fingers as well as different parts of a finger. Accordingly, arrangement of the adhesive may also be performed to address these differences. Further discussion of these and other features including formation and use of a pressure equalization device may be found in relation to the following sections.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment

Figure 1:
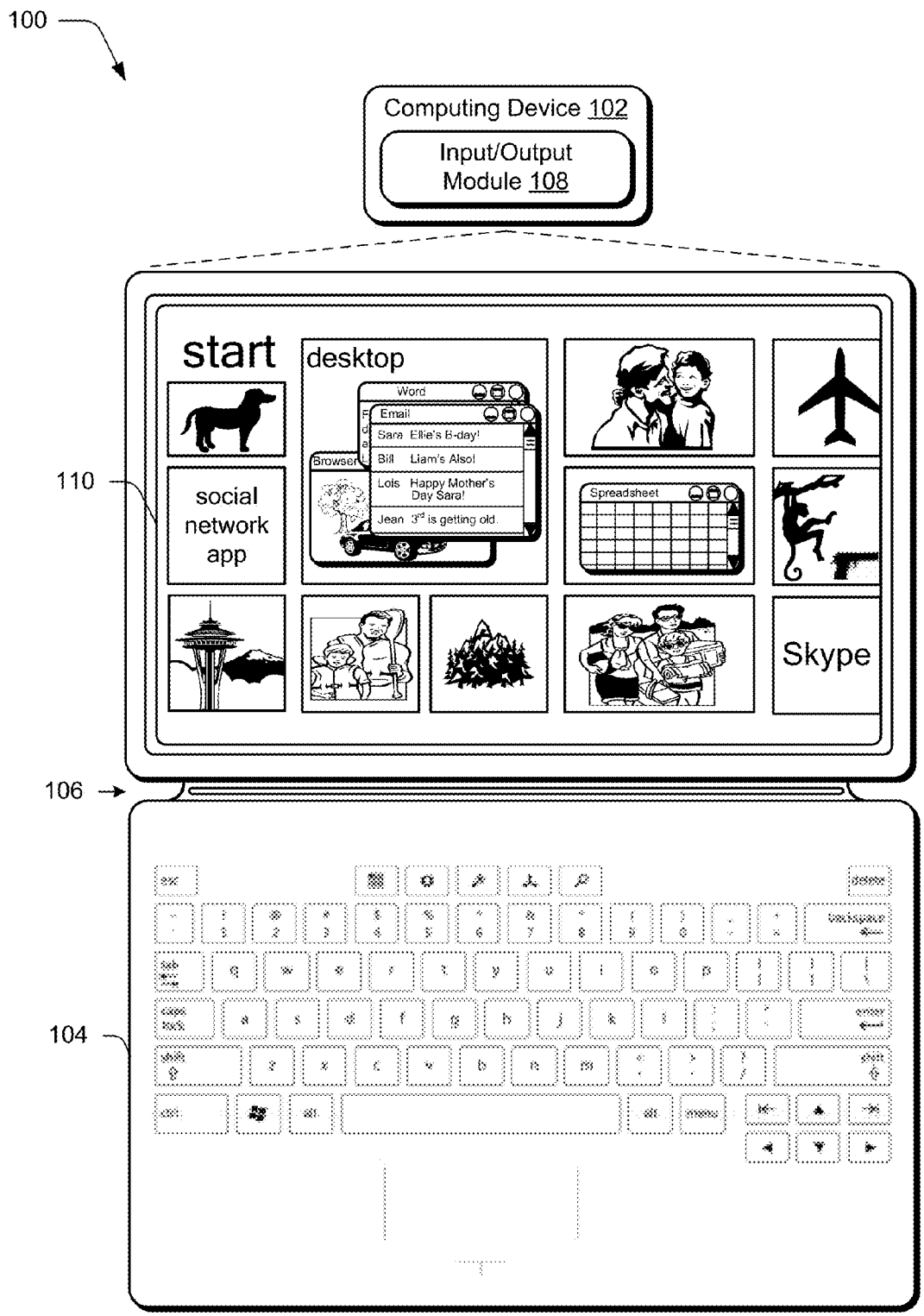
FIG. 1 is an illustration of an environment in an example implementation that is operable to employ the techniques described herein.

FIG. 1 is an illustration of an environment 100 in an example implementation that is operable to employ the techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by the display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as a keyboard having a QWERTY arrangement of keys although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one direction (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of ways, further discussion of which may be found in relation to the following figure.

Figure 2:
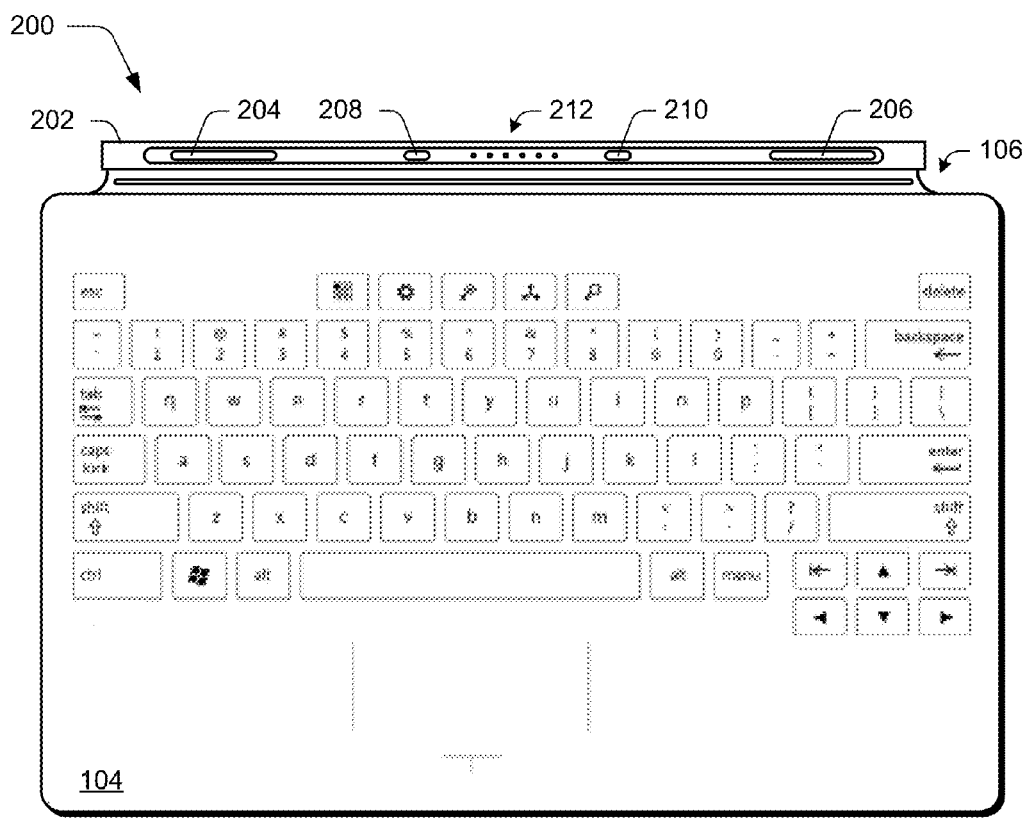
FIG. 2 depicts an example implementation of an input device of FIG. 1 as showing a flexible hinge in greater detail.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. In this example, the connection portion 202 has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

For example, rotational movement may be supported by the flexible hinge 106 such that the input device 104 may be placed against the display device 110 of the computing device 102 and thereby act as a cover. The input device 104 may also be rotated so as to be disposed against a back of the computing device 102, e.g., against a rear housing of the computing device 102 that is disposed opposite the display device 110 on the computing device 102.

Naturally, a variety of other orientations are also supported. For instance, the computing device 102 and input device 104 may assume an arrangement such that both are laid flat against a surface as shown in FIG. 1. In another instance, a typing arrangement may be supported in which the input device 104 is laid flat against a surface and the computing device 102 is disposed at an angle to permit viewing of the display device 110, e.g., such as through use of a kickstand disposed on a rear surface of the computing device 102. Other instances are also contemplated, such as a tripod arrangement, meeting arrangement, presentation arrangement, and so forth.

The connecting portion 202 is illustrated in this example as including magnetic coupling devices 204, 206, mechanical coupling protrusions 208, 210, and a plurality of communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connecting portion 202 also includes mechanical coupling protrusions 208, 210 to form a mechanical physical connection between the input device 104 and the computing device 102. The mechanical coupling protrusions 208, 210 are shown in greater detail in the following figure.

Figure 3:
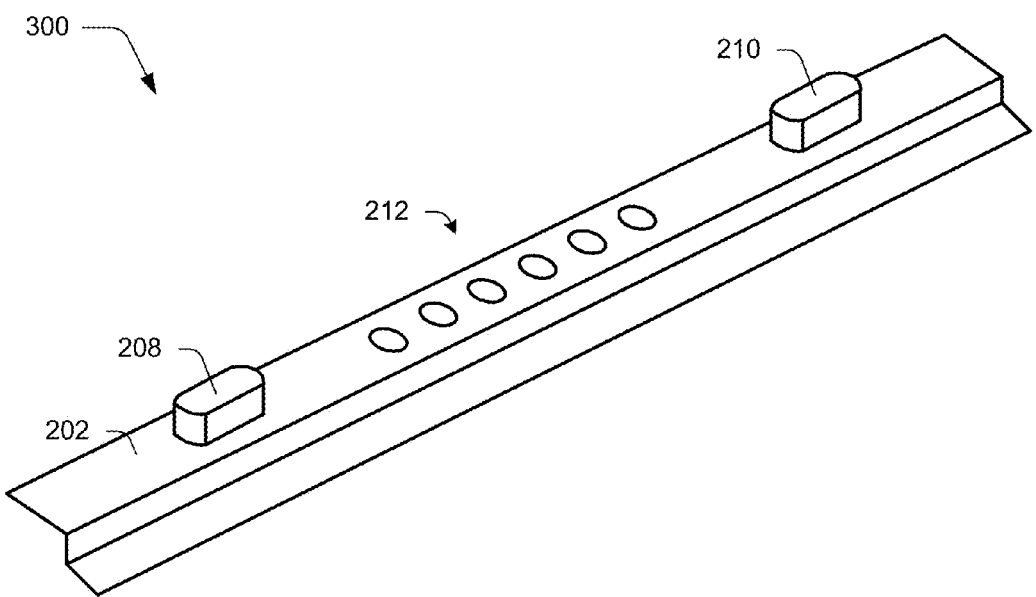
FIG. 3 depicts an example implementation showing a perspective view of a connecting portion of FIG. 2 that includes mechanical coupling protrusions and a plurality of communication contacts.

FIG. 3 depicts an example implementation 300 shown a perspective view of the connecting portion 202 of FIG. 2 that includes the mechanical coupling protrusions 208, 210 and the plurality of communication contacts 212. As illustrated, the mechanical coupling protrusions 208, 210 are configured to extend away from a surface of the connecting portion 202, which in this case is perpendicular although other angles are also contemplated.

The mechanical coupling protrusions 208, 210 are configured to be received within complimentary cavities within the channel of the computing device 102. When so received, the mechanical coupling protrusions 208, 210 promote a mechanical binding between the devices when forces are applied that are not aligned with an axis that is defined as correspond to the height of the protrusions and the depth of the cavity.

For example, when a force is applied that does coincide with the longitudinal axis described previously that follows the height of the protrusions and the depth of the cavities, a user overcomes the force applied by the magnets solely to separate the input device 104 from the computing device 102. However, at other angles the mechanical coupling protrusion 208, 210 are configured to mechanically bind within the cavities, thereby creating a force to resist removal of the input device 104 from the computing device 102 in addition to the magnetic force of the magnetic coupling devices 204, 206. In this way, the mechanical coupling protrusions 208, 210 may bias the removal of the input device 104 from the computing device 102 to mimic tearing a page from a book and restrict other attempts to separate the devices.

The connecting portion 202 is also illustrated as including a plurality of communication contacts 212. The plurality of communication contacts 212 is configured to contact corresponding communication contacts of the computing device 102 to form a communicative coupling between the devices. The communication contacts 212 may be configured in a variety of ways, such as through formation using a plurality of spring loaded pins that are configured to provide a consistent communication contact between the input device 104 and the computing device 102. Therefore, the communication contact may be configured to remain during minor movement of jostling of the devices. A variety of other examples are also contemplated, including placement of the pins on the computing device 102 and contacts on the input device 104.

Figure 4:
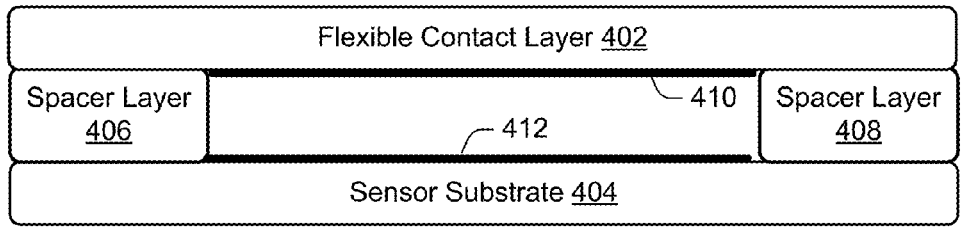
FIG. 4 depicts an example of a cross-sectional view of a pressure sensitive key of a keyboard of the input device of FIG. 2.

FIG. 4 depicts an example of a cross-sectional view of a pressure sensitive key 400 of a keyboard of the input device 104 of FIG. 2. The pressure sensitive key 400 in this example is illustrated as being formed using a flexible contact layer 402 (e.g., Mylar) that is spaced apart from the sensor substrate 404 using a spacer layer 406, 408, which may be formed as another layer of Mylar or other bendable material, formed on the sensor substrate 404, and so on. In this example, the flexible contact layer 402 does not contact the sensor substrate 404 absent application of pressure against the flexible contact layer 402.

The flexible contact layer 402 in this example includes a force sensitive ink 410 disposed on a surface of the flexible contact layer 402 that is configured to contact the sensor substrate 404. The force sensitive ink 410 is configured such that an amount of resistance of the ink varies directly in relation to an amount of pressure applied. The force sensitive ink 410, for instance, may be configured with a relatively rough surface that is compressed against the sensor substrate 404 upon an application of pressure against the flexible contact layer 402. The greater the amount of pressure, the more the force sensitive ink 410 is compressed, thereby increasing conductivity and decreasing resistance of the force sensitive ink 410. Other conductors may also be disposed on the flexible contact layer 402 without departing form the spirit and scope therefore, including other types of pressure sensitive and non-pressure sensitive conductors.

The sensor substrate 404 includes a one or more conductors 412 disposed thereon that are configured to be contacted by the force sensitive ink 410 of the flexible contact layer 402. When contacted, an analog signal may be generated for processing by the input device 104 and/or the computing device 102, e.g., to recognize whether the signal is likely intended by a user to provide an input for the computing device 102. A variety of different types of conductors 412 may be disposed on the sensor substrate 404, such as formed from a variety of conductive materials (e.g., silver, copper), disposed in a variety of different configurations such as inter-digitated trace fingers, support use of a single conductor, and so on.

Figure 5:
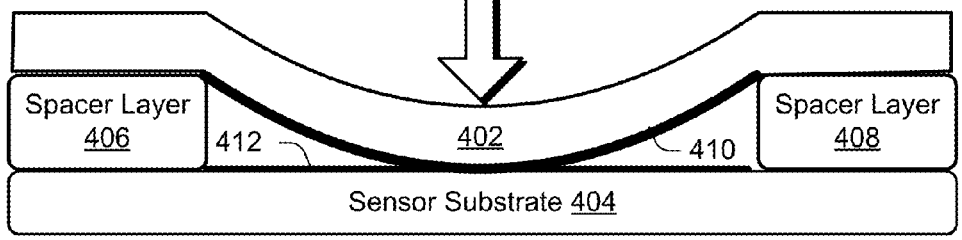
FIG. 5 depicts an example of a pressure sensitive key of FIG. 4 as having pressure applied at a first location of a flexible contact layer to cause contact with a corresponding first location of a sensor substrate.

FIG. 5 depicts an example 500 of the pressure sensitive key 400 of FIG. 4 as having pressure applied at a first location of the flexible contact layer 402 to cause contact of the force sensitive ink 410 with a corresponding first location of the sensor substrate 404. The pressure is illustrated through use of an arrow in FIG. 5 and may be applied in a variety of ways, such as by a finger of a user's hand, stylus, pen, and so on. In this example, the first location at which pressure is applied as indicated by the arrow is located generally near a center region of the flexible contact layer 402 that is disposed between the spacer layers 406, 408. Due to this location, the flexible contact layer 402 may be considered generally flexible (e.g., bendable and/or stretchable) and thus responsive to the pressure.

This flexibility permits a relatively large area of the flexible contact layer 402, and thus the force sensitive ink 410, to contact the conductors 412 of the sensor substrate 404. Thus, a relatively strong signal may be generated. Further, because the flexibility of the flexible contact layer 402 is relatively high at this location, a relatively large amount of the force may be transferred through the flexible contact layer 402, thereby applying this pressure to the force sensitive ink 410. As previously described, this increase in pressure may cause a corresponding increase in conductivity of the force sensitive ink and decrease in resistance of the ink. Thus, the relatively high amount of flexibility of the flexible contact layer at the first location may cause a relatively stronger signal to be generated in comparison with other locations of the flexible contact layer 402 that located closer to an edge of the key, an example of which is described in relation to the following figure.

Figure 6:
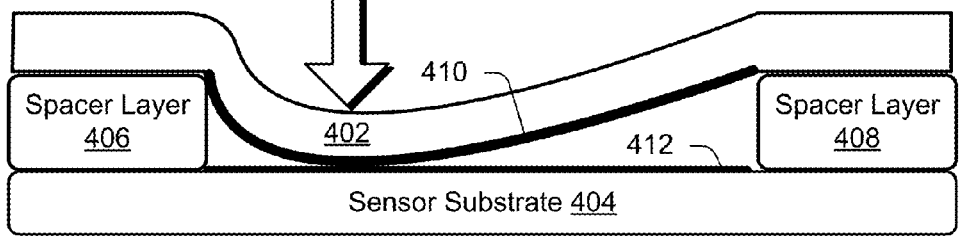
FIG. 6 depicts an example of the pressure sensitive key of FIG. 4 as having pressure applied at a second location of the flexible contact layer to cause contact with a corresponding second location of the sensor substrate.

FIG. 6 depicts an example 600 of the pressure sensitive key 400 of FIG. 4 as having pressure applied at a second location of the flexible contact layer 402 to cause contact with a corresponding second location of the sensor substrate 404. In this example, the second location of FIG. 6 at which pressure is applied is located closer to an edge of the pressure sensitive key (e.g., closer to an edge of the spacer layer 406) than the first location of FIG. 5. Due to this location, the flexible contact layer 402 has reduced flexibility when compared with the first location and thus less responsive to pressure.

This reduced flexibility may cause a reduction in an area of the flexible contact layer 402, and thus the force sensitive ink 410, that contacts the conductors 412 of the sensor substrate 404. Thus, a signal produced at the second location may be weaker than a signal produced at the first location of FIG. 5.

Further, because the flexibility of the flexible contact layer 402 is relatively low at this location, a relatively low amount of the force may be transferred through the flexible contact layer 402, thereby reducing the amount of pressure transmitted to the force sensitive ink 410. As previously described, this decrease in pressure may cause a corresponding decrease in conductivity of the force sensitive ink and increase in resistance of the ink in comparison with the first location of FIG. 5. Thus, the reduced flexibility of the flexible contact layer 402 at the second location in comparison with the first location may cause a relatively weaker signal to be generated. Further, this situation may be exacerbated by a partial hit in which a smaller portion of the user's finger is able to apply pressure at the second location of FIG. 6 in comparison with the first location of FIG. 5.

However, as previously described adhesive used to secure the flexible contact layer 402 with the spacer layer 406 may be arranged (e.g., patterned) to promote flexibility of the flexible contact layer 402 at desired locations of the key, further discussion of which may be found in relation to the following figure.

Figure 7:
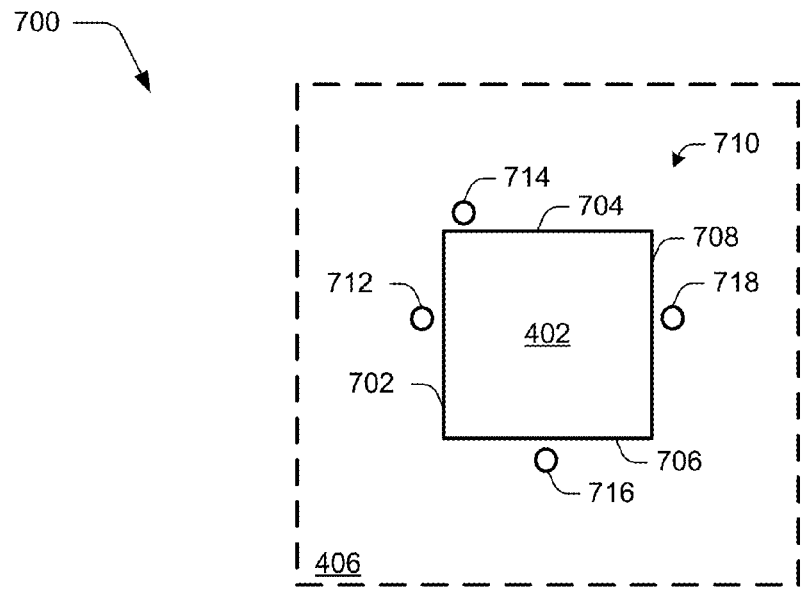
FIG. 7 depicts a bottom view of a pressure sensitive key of FIG. 4 as having a flexible contact layer secured at a plurality of locations along edges of the key.

FIG. 7 depicts a top view 700 of a pressure sensitive key of FIG. 4 as having the flexible contact layer 402 secured at a plurality of locations along edges of the key. First, second, third, and fourth edges 702, 704, 706, 708 are illustrated in this example as defining an opening 710 of a spacer layer 406/408 of a pressure sensitive key. The opening 710 as described in relation to FIGS. 4-6 permits the flexible contact layer 402 to flex (e.g., bend and/or stretch) through the opening 710 to contact the one or more conductors 412 of the sensor substrate 404.

In the illustrated example, a first securing portion 712 is illustrated as disposed proximal to the first edge 702 of the opening 710. Likewise, second, third, and fourth securing portions 714, 716, 718 are illustrated as disposed proximal to respective second, third, and fourth edges 704, 706, 708 of the opening 710. The securing portions may be configured in a variety of ways, such as through use of an adhesive, mechanical securing device (e.g., pins), and so on. Furthermore, securing portions maybe configured without adhesive and only provide structure integrity. For example, the structural support and/or adhesive may be applied as a series of dots or other shapes to the spacer layer 406 which is then contacted (e.g., pressed) to the flexible contact layer 402.

Regardless of the technique used to secure the flexible contact layer 402 to the spacer layer 406, flexibility may be configured as desired by permitting portions of the flexible contact layer 402 along the edge of the opening to remain unsecured. For instance, the first and second securing portions 714, 716 may define sole areas at which the flexible contact layer 402 is secured to the spacer layer 406 along the respective first and second edges 702, 704. Therefore, flexibility of the flexible contact layer 402 may decrease as a distance between a point of contact of the pressure and a securing portion decreases similar to the edge discussion of FIGS. 5 and 6, such as due to sliding of the flexible contact layer over the edge, permit increased stretching, and so forth.

However, the reverse is also true in that flexibility increases the further away pressure is applied from the securing portions. Thus, flexibility along the edges of the opening 710 may be increased by including portions along an edge at which the flexible contact layer 402 is not secured (proximally) to the spacer layer 406. Thus, different arrangements of how the flexible contact layer 402 is secured to the spacer layer 404 may be used to support different amounts of flexibility at different locations of the flexible contact layer 402.

For example, as illustrated the first and second securing portions 712, 714 are located closer together than the first and third securing portions 712, 716. Accordingly, points (e.g., a midpoint) between the first and third securing portions 712, 716 may have greater flexibility than corresponding points (e.g., a midpoint) between the first and second securing portions 712, 714. In this way, a designer may configure the flexible contact surface 402 to increase or decrease flexibility at particular locations as desired.

Figure 8:
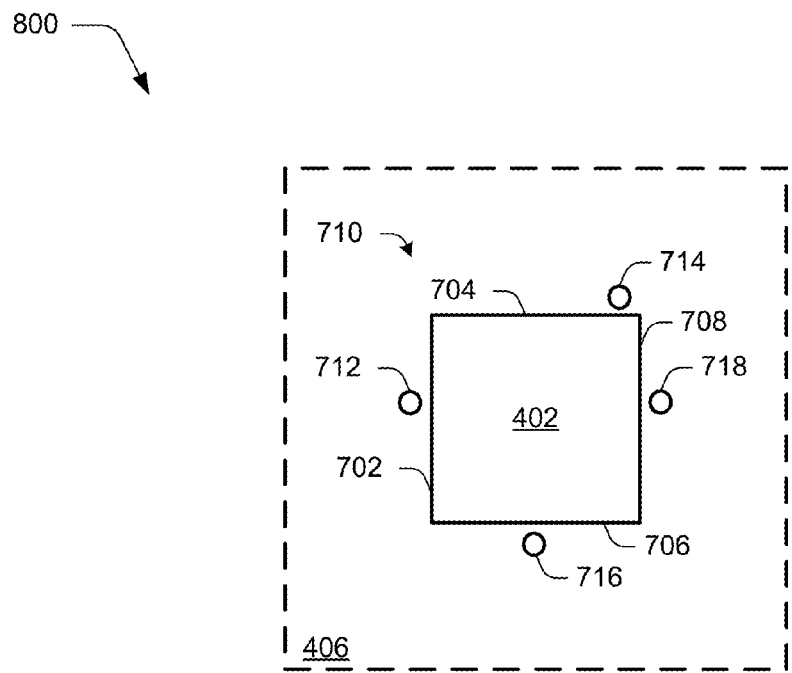
FIG. 8 depicts another version of FIG. 7 in which a securing portion is moved to a different location along an edge of the key.

In the example 800 of FIG. 8, for instance, the second securing portion 714 is moved from one end of the second edge 704 to an opposing end of the second edge 704. Thus, flexibility is increased on the left upper portion of the key in this example and decreased in the upper right portion of the key. A variety of other examples are also contemplated, examples of which are shown in relation to a keyboard in the following example.

Figure 9A:
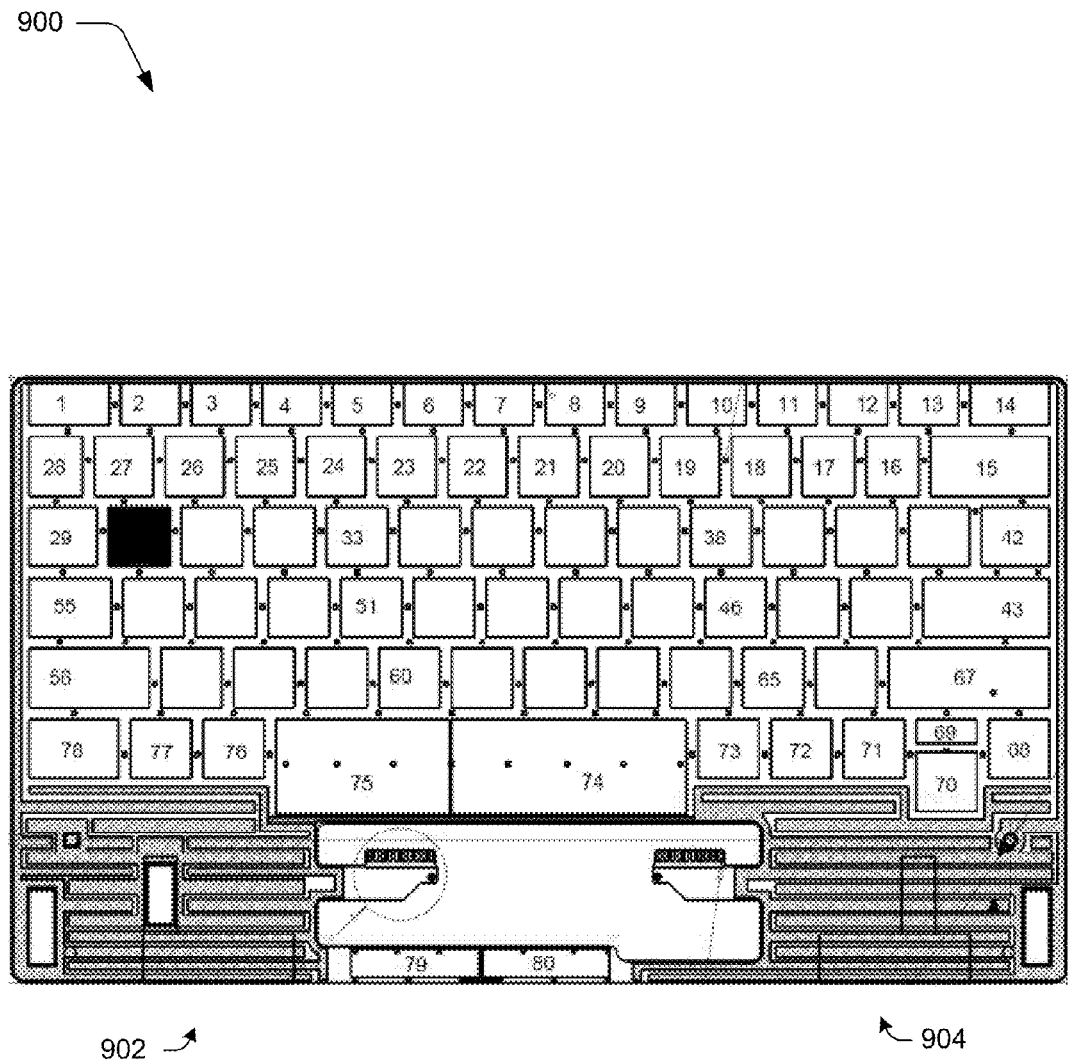
FIG. 9A depicts an example of an adhesive layer applied as part of a keyboard having a plurality of keys in which different arrangements of adhesive are used for different keys.

FIG. 9A depicts an example of a spacer layer 900 applied as part of a keyboard having a plurality of keys in which different arrangements of support structure and/or adhesive are used for different keys. Securing portions in this example are illustrated in shaded (cross hatched) lines in regions of support structure and adhesive while the dots depict only support structure regions that are used to secured the flexible contact layer 402 with the sensor substrate 404. As shown, different arrangements of the securing portions may be used to address differences in how corresponding keys are likely to be pressed.

For example, as shown the arrangements of support structure for respective keys in the home row (e.g., keys 43-55) is different than arrangements of support structure for a row of keys in the next lower row, e.g., keys 56-67. This may be performed to address "where" a key is likely to be pressed, such as at a center or particular one of the four sides of the key. This may also be performed to address "how" a key a likely to be pressed, such as using a pad of a finger as opposed to a user's fingernail, which finger of a user is likely to press the key, and so on. Thus, as illustrated in the example adhesive layer 900 of FIG. 9, different arrangements may be used for different rows of keys as well as for different columns of the keys.

The spacer layer 900 in this example is also illustrated as forming first and second pressure equalization devices 902, 904. In this example, support structure and/or adhesive is disposed to leave channels formed between the support structure and/or adhesive. Thus, the support structure and/or adhesive defines the channels that form the device. The channels are configured to connect openings 710 formed as part of the pressure sensitive keys between the flexible contact layer 402 and the sensor substrate 404 to an outside environment of the input device 104.

In this way, air may move between the outside environment and the openings through the channels to generally equalize the air pressure, which may help prevent damage to the input device 104, e.g., when faced with reduced air pressure in an airplane. In one or more implementations, the channels may be formed as a labyrinth having a plurality of bends to protect against outside contaminants from passing through the pressure equalization devices 902, 904 to the openings 710. In the illustrated example, the pressure equalization devices 902, 904 are disposed as part of a palm rest of the spacer layer to leverage available space to form longer channels and thus further protect against contamination. Naturally, a wide variety of other examples and locations are also contemplated without departing from the spirit and scope thereof.

Figure 9B:
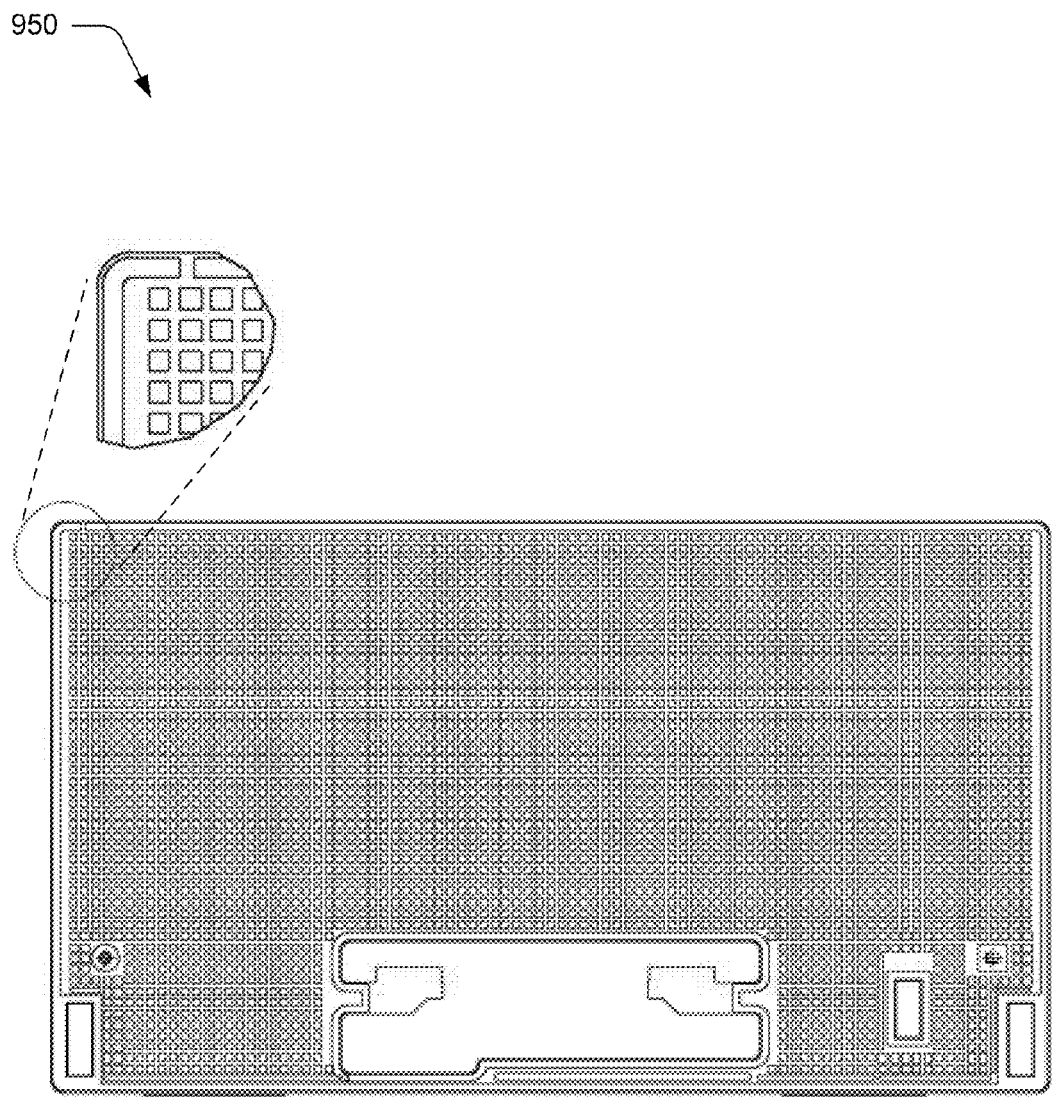
FIG. 9B depicts another example implementation of a layer incorporating a matric that may be used to reduce air entrapment.

FIG. 9B depicts another example implementation of a layer 950 incorporating a matric that may be used to reduce air entrapment. In this example, strategic adhesive placement (or other securing techniques) is used to reduce air entrapment between consecutive layers. In the previous example, a vented labyrinth seal in the sensor substrate/flexible contact layer interface was described.

In this example, a layer (e.g., below the sensor substrate 202) is not configured as a "full bleed adhesive sheet," but instead is a square matrix of adhesive patches that bind the consecutive layers together. This allows easier assembly and eliminates air entrapment between layers. In this way, multiple layers may be bonded together through adhesive construction to achieve thin profile, stiffness, and allow internal electronics nesting of components.

Example System and Device

Figure 10:
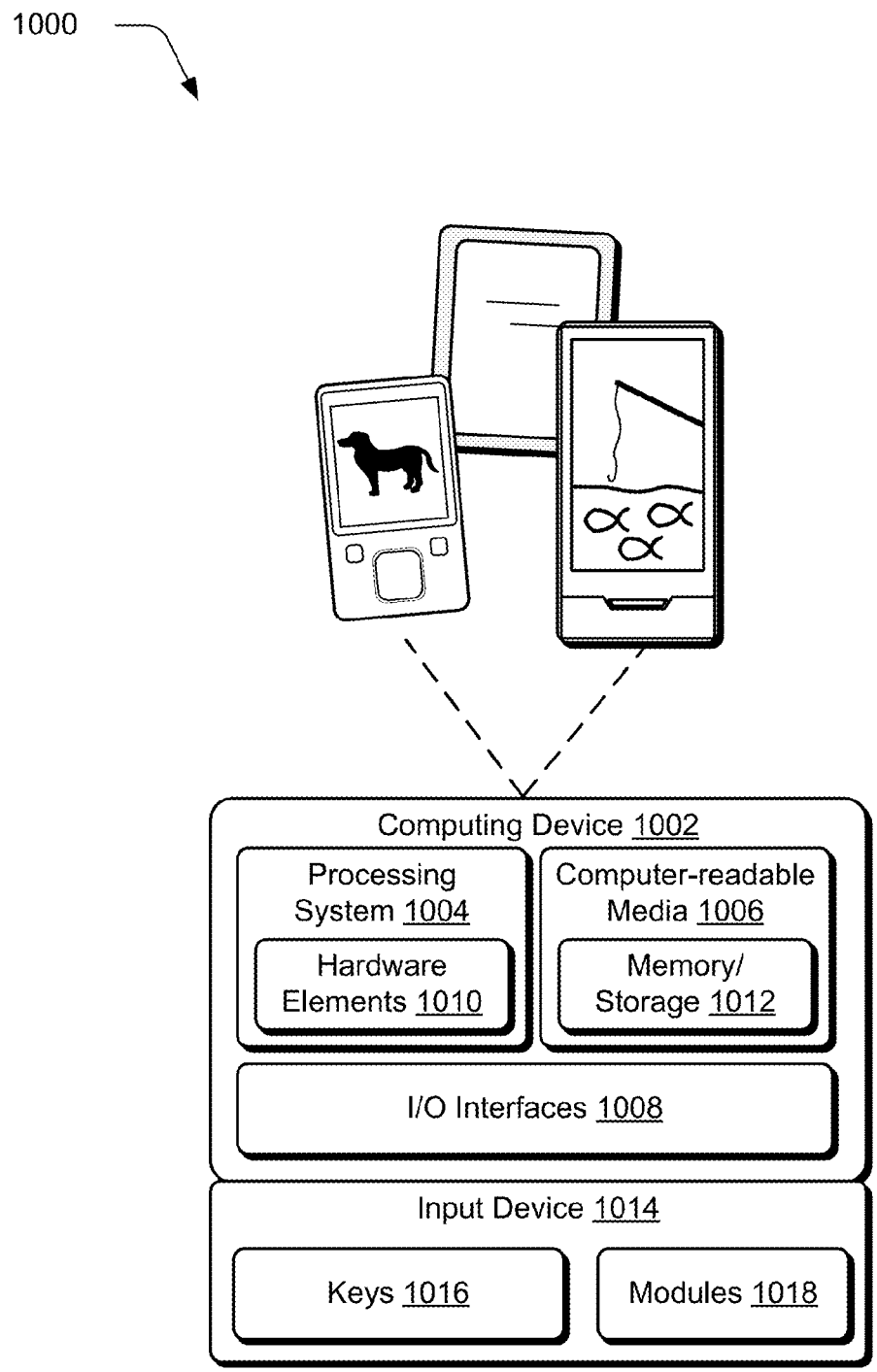
FIG. 10 illustrates an example system including various components of an example device that can be implemented as any type of computing device as described with reference to FIGS. 1-9 to implement embodiments of the techniques described herein.

FIG. 10 illustrates an example system generally at 1000 that includes an example computing device 1002 that is representative of one or more computing systems and/or devices that may implement the various techniques described herein. The computing device 1002 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1002 as illustrated includes a processing system 1004, one or more computer-readable media 1006, and one or more I/O interface 1008 that are communicatively coupled, one to another. Although not shown, the computing device 1002 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1004 is representative of functionality to perform one or more operations using hardware. Accordingly, the processing system 1004 is illustrated as including hardware element 1010 that may be configured as processors, functional blocks, and so forth. This may include implementation in hardware as an application specific integrated circuit or other logic device formed using one or more semiconductors. The hardware elements 1010 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1006 is illustrated as including memory/storage 1012. The memory/storage 1012 represents memory/storage capacity associated with one or more computer-readable media. The memory/storage component 1012 may include volatile media (such as random access memory (RAM)) and/or nonvolatile media (such as read only memory (ROM), Flash memory, optical disks, magnetic disks, and so forth). The memory/storage component 1012 may include fixed media (e.g., RAM, ROM, a fixed hard drive, and so on) as well as removable media (e.g., Flash memory, a removable hard drive, an optical disc, and so forth). The computer-readable media 1006 may be configured in a variety of other ways as further described below.

Input/output interface(s) 1008 are representative of functionality to allow a user to enter commands and information to computing device 1002, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1002 may be configured in a variety of ways to support user interaction.

The computing device 1002 is further illustrated as being communicatively and physically coupled to an input device 1014 that is physically and communicatively removable from the computing device 1002. In this way, a variety of different input devices may be coupled to the computing device 1002 having a wide variety of configurations to support a wide variety of functionality. In this example, the input device 1014 includes one or more keys 1016, which may be configured as pressure sensitive keys, mechanically switched keys, and so forth.

The input device 1014 is further illustrated as include one or more modules 1018 that may be configured to support a variety of functionality. The one or more modules 1018, for instance, may be configured to process analog and/or digital signals received from the keys 1016 to determine whether a keystroke was intended, determine whether an input is indicative of resting pressure, support authentication of the input device 1014 for operation with the computing device 1002, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1002. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1002, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1010 and computer-readable media 1006 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1010. The computing device 1002 may be configured to implement particular instructions and/or functions corresponding to the software and/or hardware modules. Accordingly, implementation of a module that is executable by the computing device 1002 as software may be achieved at least partially in hardware, e.g., through use of computer-readable storage media and/or hardware elements 1010 of the processing system 1004. The instructions and/or functions may be executable/operable by one or more articles of manufacture (for example, one or more computing devices 1002 and/or processing systems 1004) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. An input device comprising:
   a sensor substrate having a first set of one or more conductors of a first pressure sensitive key and a second set of one or more conductors of a second pressure sensitive key;
   a spacer layer disposed proximal to the sensor substrate and having first and second openings that expose the first and second sets of conductors, respectively; and
   a flexible contact layer spaced apart from the sensor substrate by the spacer layer and configured to flex through the first and second openings responsive to an applied pressure to contact, respectively, the first and second sets of conductors to initiate respective first and second inputs, in which an arrangement of adhesive that secures the flexible contact layer to the spacer layer along one or more edges of the first opening corresponding to the first pressure sensitive key is different than an arrangement of adhesive that secures the flexible contact layer to the spacer layer along one or more edges of the second opening corresponding to the second pressure sensitive key, the arrangements including discrete portions of applied adhesive, and defining portions along the edges of the openings corresponding to the first and second pressure sensitive keys, respectively, that do not include adhesive.

2. An input device as described in claim 1, wherein the arrangements define portions along the edges of the first and second pressure sensitive keys, respectively, that do not include adhesive thereby permitting greater flexibility of the flexible contact layer to contact the sensor substrate at a location disposed proximal to the portion of the edge that does not include the adhesive in comparison with a portion of the edge that does include the adhesive.

3. An input device as described in claim 1, wherein the first pressure sensitive key is configured for inclusion as part of a home row of a keyboard and the second pressure sensitive key is not included as part of the home row of the keyboard.

4. An input device as described in claim 1, wherein the arrangements are configured to address a likelihood of missed hits of the respective first and second pressure sensitive keys.

5. An input device comprising:
a sensor substrate having a first set of one or more conductors of a first pressure sensitive key and a second set of one or more conductors of a second pressure sensitive key;
a spacer layer disposed proximal to the sensor substrate and having first and second openings that expose the first and second sets of conductors, respectively; and
a flexible contact layer spaced apart from the sensor substrate by the spacer layer and configured to flex through the first and second openings responsive to an applied pressure to contact, respectively, the first and second sets of conductors to initiate respective first and second inputs using a force sensitive ink, in which an arrangement of adhesive that secures the flexible contact layer to the spacer layer along one or more edges of the first opening corresponding to the first pressure sensitive key is different than an arrangement of adhesive that secures the flexible contact layer to the spacer layer along one or more edges of the second opening corresponding to the second pressure sensitive key, the arrangements including discrete portions of applied adhesive, and defining portions along the edges of the openings corresponding to the first and second pressure sensitive keys, respectively, that do not include adhesive.

6. An input device as described in claim 5, wherein the arrangements define portions along the edges of the first and second pressure sensitive keys, respectively, that do not include adhesive thereby permitting greater flexibility of the flexible contact layer to contact the sensor substrate at a location disposed proximal the portion of the edge that does not include the adhesive in comparison with a portion of the edge that does include the adhesive.

7. An input device as described in claim 5, wherein the first pressure sensitive key is configured for inclusion as part of a home row of a keyboard and the second pressure sensitive key is not included as part of the home row of the keyboard.

8. An input device as described in claim 5, wherein the arrangements are configured to address a likelihood of missed hits of the respective first and second pressure sensitive keys.

9. An input device as described in claim 5, wherein an amount of pressure applied to the flexible contact layer that is usable to initiate an input for the first pressure sensitive key is different than an amount of pressure applied to the flexible contact layer that is usable to initiate an input for the second pressure sensitive key.

10. An input device as described in claim 5, wherein flexibility of the flexible contact layer for the first pressure sensitive key is different than flexibility of the flexible contact layer for the second pressure sensitive key.

11. An input device as described in claim 5, wherein flexibility of the flexible contact layer along edges of the first pressure sensitive key or the second pressure sensitive key is different, one to another, for the first pressure sensitive key or the second pressure sensitive key.

12. An input device comprising:
a sensor substrate having a plurality of conductors that support a plurality of pressure sensitive keys;
a spacer layer disposed proximal to the sensor substrate and having openings that expose the plurality of conductors of the plurality of pressure sensitive keys, respectively; and
a flexible contact layer spaced apart from the sensor substrate by the spacer layer and configured to flex through the openings responsive to an applied pressure to contact respective said conductors of the respective said keys, in which arrangements of adhesive along edges of the openings that secures the flexible contact layer to the spacer layer varies for first and second said pressure sensitive keys, one to another, the arrangements including discrete portions of applied adhesive, and defining portions along edges of the openings corresponding to the first and second said pressure sensitive keys, respectively, that do not include adhesive.

13. An input device as described in claim 12, wherein the arrangements define portions along edges of the first and second pressure sensitive keys, respectively, that do not include adhesive thereby permitting greater flexibility of the flexible contact layer to contact the sensor substrate at a location disposed proximal the portion of the edge that does not include the adhesive in comparison with a portion of the edge that does include the adhesive.

14. An input device as described in claim 12, wherein the first said pressure sensitive key is configured for inclusion as part of a home row of a keyboard and the second said pressure sensitive key is not included as part of the home row of the keyboard.

15. An input device as described in claim 12, wherein the arrangements are configured to address a likelihood of missed hits of the respective first and second said pressure sensitive keys.

16. An input device as described in claim 12, wherein an amount of pressure applied the flexible contact layer that is usable to initiate an input for the first said pressure sensitive key is different than an amount of pressure applied to the flexible contact layer that is usable to initiate an input for the second said pressure sensitive key.

17. An input device as described in claim 12, wherein flexibility of the flexible contact layer for the first said pressure sensitive key is different than flexibility of the flexible contact layer for the second said pressure sensitive key.

18. An input device as described in claim 12, wherein flexibility of the flexible contact layer along edges of the first said pressure sensitive key or the second said pressure sensitive key is different, one to another, for the first pressure said sensitive key or the second said pressure sensitive key.

* * * * *